US010964039B2

(12) United States Patent
Link

(10) Patent No.: US 10,964,039 B2
(45) Date of Patent: Mar. 30, 2021

(54) DEPTH SENSING SYSTEMS AND METHODS

(71) Applicant: Magic Leap, Inc., Plantation, FL (US)

(72) Inventor: Gregory Michael Link, Half Moon Bay, CA (US)

(73) Assignee: Magic Leap, Inc., Plantation, FL (US)

( * ) Notice: Subject to any disclaimer, the term of this patent is extended or adjusted under 35 U.S.C. 154(b) by 0 days.

(21) Appl. No.: 16/737,765

(22) Filed: Jan. 8, 2020

(65) Prior Publication Data

US 2020/0143553 A1 May 7, 2020

Related U.S. Application Data

(62) Division of application No. 15/445,818, filed on Feb. 28, 2017, now Pat. No. 10,565,717.

(Continued)

(51) Int. Cl.
*G06T 7/521* (2017.01)
*H04N 9/04* (2006.01)

(Continued)

(52) U.S. Cl.
CPC .............. *G06T 7/521* (2017.01); *G01B 11/22* (2013.01); *G02B 5/208* (2013.01); *G02B 27/1013* (2013.01); *G06T 7/13* (2017.01); *G06T 7/50* (2017.01); *G06T 7/55* (2017.01); *G06T 7/74* (2017.01); *H01L 27/14605* (2013.01); *H01L 27/14621* (2013.01); *H04N 5/2226* (2013.01); *H04N 5/2258* (2013.01); *H04N 5/332* (2013.01); *H04N 5/369* (2013.01); *H04N 5/3696* (2013.01); *H04N 5/36965* (2018.08);

(Continued)

(58) Field of Classification Search
CPC ................................................ G06T 7/50–596
See application file for complete search history.

(56) References Cited

U.S. PATENT DOCUMENTS

| | | | | |
|---|---|---|---|---|
| 5,621,529 A * | 4/1997 | Gordon | G01B 11/00 | 250/237 G |
| 6,510,244 B2 * | 1/2003 | Proesmans | G01B 11/2513 | 382/203 |

(Continued)

FOREIGN PATENT DOCUMENTS

| | | |
|---|---|---|
| CN | 102685534 | 9/2012 |
| CN | 102663725 | 7/2014 |

(Continued)

OTHER PUBLICATIONS

Salvi et al.,"Pattern codification strategies in structured light systems", Institut d'Informatica i Aplicacaions, Universitat de Girona, 2004 (Year: 2004).*

(Continued)

*Primary Examiner* — Robert J Hance
(74) *Attorney, Agent, or Firm* — Vista IP Law Group, LLP

(57) ABSTRACT

A depth sensing system includes a sensor having first and second sensor pixels to receive light from a surface. The system also includes a filter to allow transmission of full spectrum light to the first sensor pixel and visible light to the second sensor pixel while preventing transmission of infrared light to the second sensor pixel. The system further includes a processor to analyze the full spectrum light and the visible light to determine a depth of the surface. The filter is disposed between the sensor and the surface.

18 Claims, 21 Drawing Sheets

400
404a
402
404b
416
Actuator
418
Processor
Pattern Designer
420
Pattern Detector
406

Related U.S. Application Data

(60) Provisional application No. 62/301,847, filed on Mar. 1, 2016.

(51) Int. Cl.

| | |
|---|---|
| ***H04N 5/369*** | (2011.01) |
| ***G06T 7/55*** | (2017.01) |
| ***H01L 27/146*** | (2006.01) |
| ***G06T 7/50*** | (2017.01) |
| ***H04N 5/222*** | (2006.01) |
| ***H04N 5/225*** | (2006.01) |
| ***G02B 27/10*** | (2006.01) |
| ***G06T 7/73*** | (2017.01) |
| ***G06T 7/13*** | (2017.01) |
| ***G01B 11/22*** | (2006.01) |
| ***G02B 5/20*** | (2006.01) |
| ***H04N 5/33*** | (2006.01) |

(52) U.S. Cl.

CPC ......... *H04N 9/045* (2013.01); *H04N 9/04553* (2018.08); *H04N 9/04555* (2018.08); *G06T 2207/10028* (2013.01); *G06T 2207/10048* (2013.01)

(56) References Cited

U.S. PATENT DOCUMENTS

| | | | | |
|---|---|---|---|---|
| 8,619,082 | B1 | 12/2013 | Ciurea et al. | |
| 8,723,118 | B2 | 5/2014 | McEldowney et al. | |
| 8,917,327 | B1 | 12/2014 | Bishay et al. | |
| 9,325,973 | B1 * | 4/2016 | Hazeghi | G02B 27/4272 |
| 9,646,384 | B2 * | 5/2017 | Lee | G06K 9/00208 |
| 10,051,211 | B2 | 8/2018 | Chen et al. | |
| 2006/0082787 | A1 * | 4/2006 | Franke | G06T 7/521 356/604 |
| 2007/0057946 | A1 * | 3/2007 | Albeck | G06T 7/521 345/427 |
| 2009/0316116 | A1 * | 12/2009 | Melville | A61B 1/07 353/31 |
| 2010/0191541 | A1 | 7/2010 | Prokoski | |
| 2011/0079714 | A1 | 4/2011 | McEldowney et al. | |
| 2011/0085063 | A1 | 4/2011 | Min et al. | |
| 2011/0102547 | A1 | 5/2011 | Sul et al. | |
| 2011/0141252 | A1 | 6/2011 | Schmidt | |
| 2011/0251252 | A1 | 10/2011 | Wang et al. | |
| 2012/0140099 | A1 | 6/2012 | Kim et al. | |
| 2012/0146172 | A1 | 6/2012 | Carey et al. | |
| 2012/0236121 | A1 | 9/2012 | Park et al. | |
| 2013/0026253 | A1 | 1/2013 | Hansen et al. | |
| 2014/0340539 | A1 | 11/2014 | Venkataraman et al. | |
| 2015/0205126 | A1 | 7/2015 | Schowengerdt | |
| 2015/0256813 | A1 | 9/2015 | Dal Mutto et al. | |
| 2015/0296150 | A1 | 10/2015 | Benmokhtar Benabdellah et al. | |
| 2016/0288330 | A1 | 10/2016 | Konolige | |
| 2017/0068319 | A1 * | 3/2017 | Viswanathan | G06T 7/521 |
| 2018/0176498 | A1 | 6/2018 | Elkhatib et al. | |
| 2018/0367746 | A1 | 12/2018 | Toda | |
| 2020/0143553 | A1 | 5/2020 | Link | |

FOREIGN PATENT DOCUMENTS

| | | | |
|---|---|---|---|
| CN | 107667527 | 2/2018 | |
| JP | 2001194114 | 7/2001 | |
| WO | WO-2005010825 A2 * | 2/2005 | G06K 9/209 |
| WO | WO-2014020823 A1 * | 2/2014 | G06T 1/0007 |
| WO | WO-2016147888 A1 * | 9/2016 | G06T 7/70 |

OTHER PUBLICATIONS

International Search Report and Written Opinion dated Jun. 22, 2017 for PCT App No. PCT/US2017/020030, 11 pgs.

Extended European Search Report for EP Patent Appln. No. 17760653.0, dated Nov. 7, 2018 (9 pages).

Response to Extended European Search Report for EP Patent Appln. No. 17760653.0, filed May 31, 2019 (18 pages).

Examiner's Report for European Patent Appln. No. 17760653.0, dated Jul. 17, 2019 (4 pages).

RCE and Amendment filed Aug. 5, 2019 for U.S. Appl. No. 15/445,818.

Notice of Allowance dated Oct. 10, 2019 for U.S. Appl. No. 15/445,818.

Response to Examiner's Report for European Patent Appln. No. 17760653.0, filed Nov. 13, 2019 (13 pages).

Examiner's Report for European Patent Appln. No. 17760653.0, dated Nov. 29, 2019 (6 pages).

Reply to 2nd Examination Report for EP Patent Appln. No. 17760653.0, dated Apr. 2, 2020 (4 pages).

1st Office Action for Chinese Patent Appln. No. 201780014934.2 dated Feb. 26, 2020 with translation.

Office Action Response for Chinese Patent Appln. No. 201780014934.2 dated Jun. 25, 2020.

Foreign OA for IL Patent Appln. No. 261149 dated Aug. 31, 2020.

Foreign Exam Report for AU Patent Application No. 2017227599 dated Nov. 11, 2020.

Foreign Written Submission for EP Patent Appln. No. 17760653.0 dated Dec. 18, 2020.

* cited by examiner

DEPTH SENSING SYSTEMS AND METHODS

CROSS-REFERENCE TO RELATED APPLICATIONS

This application is a divisional of U.S. application Ser. No. 15/445,818, entitled "DEPTH SENSING SYSTEMS AND METHODS," filed Feb. 28, 2017, which claims priority to U.S. Provisional Application Ser. No. 62/301,847, filed on Mar. 1, 2016 and entitled "DEPTH SENSING SYSTEMS AND METHODS." The present application is related to U.S. Provisional Patent Application Ser. No. 62/012,273, filed on Jun. 14, 2014 and U.S. Utility patent application Ser. No. 14/738,877 filed on Jun. 13, 2013. The contents of the aforementioned patent applications are hereby expressly and fully incorporated by reference in their entirety, as though set forth in full. Described in the patent application Ser. No. 62/012,273 and Ser. No. 14/738,877 are various embodiments of virtual reality and augmented reality systems wherein projected light is used in depth sensing. Described herein are further embodiments of projected light depth sensing systems and light sensors for depth sensing.

FIELD OF THE INVENTION

The present disclosure relates to depth sensing systems and methods.

BACKGROUND

Depth sensing is the determination of the distance between a known point in three dimensional ("3D") space (e.g., a sensor) and a point of interest ("POI") on a surface of an object. Depth sensing is also known as texture sensing because determining the respective distances of a plurality of POIs on a surface determines the texture of that surface. Depth or texture sensing is useful for many computer vision systems, including mixed reality systems.

Modern computing and display technologies have facilitated the development of mixed reality systems for so called "virtual reality" or "augmented reality" experiences, wherein digitally reproduced images or portions thereof are presented to a user in a manner wherein they seem to be, or may be perceived as, real. A virtual reality, or "VR", scenario typically involves presentation of digital or virtual image information without transparency to actual real-world visual input. An augmented reality, or "AR", scenario typically involves presentation of digital or virtual image information as an augmentation to visualization of the actual world around the user (i.e., transparency to other actual real-world visual input). Accordingly, AR scenarios involve presentation of digital or virtual image information with transparency to other actual real-world visual input.

Various optical systems generate images at various depths for displaying mixed reality (VR and AR) scenarios. Some such optical systems are described in U.S. Utility patent application Ser. No. 14/738,877, the contents of which have been previously incorporated-by-reference herein. Other such optical systems for displaying mixed reality scenarios are described in U.S. Utility patent application Ser. No. 14/555,585 filed on Nov. 27, 2014, the contents of which are hereby expressly and fully incorporated by reference in their entirety, as though set forth in full.

AR scenarios often include presentation of virtual image elements in relationship to real-world objects. For example, referring to FIG. 1, an augmented reality scene 100 is depicted wherein a user of an AR technology sees a real-world park-like setting 102 featuring people, trees, buildings in the background, and a concrete platform 104. In addition to these items, the user of the AR technology also perceives that he "sees" a robot statue 106 standing upon the real-world platform 104, and a cartoon-like avatar character 108 flying by which seems to be a personification of a bumble bee, even though these elements 106, 108 do not exist in the real world. In order to present a believable or passable AR scene 100, the depth of real world objects (e.g., the platform 104) must be determined to present virtual objects (e.g., the robot statue 106) in relation to real world objects.

VR scenarios that include reproduction of portions of real world environments can also benefit from determination of the depth and texture of those portions of the real world environment. Accurate depth and texture information will result in more accurate VR scenarios. Both AR and VR scenarios may also include outwardly directed cameras to capture portions of real world environments (e.g., for analysis or transmission). Focusing these outwardly directed cameras can be aided by determination of the depth of those portions of the real world environment.

One approach to depth sensing includes measuring the respective angles between the optical axes of two images (which are separated by a known distance at a known orientation) of a single POI on a surface and the POI on the respective images. Then determining the depth of the surface by triangulating the measured angles and the known distance between the image capture locations. Problems with this approach include (1) identification of the POI (especially on a homogenous surface) ("identification problem") in the first image and (2) identification of the corresponding POI in the second image ('correspondence problem"). The systems and methods described herein are configured to address these challenges.

SUMMARY

Embodiments of the present invention are directed to devices, systems and methods for facilitating virtual reality and/or augmented reality interaction for one or more users.

In one embodiment, a depth sensing system includes a sensor having first and second sensor pixels to receive light from a surface. The system also includes a filter to allow transmission of full spectrum light to the first sensor pixel and visible light to the second sensor pixel while preventing transmission of infrared light to the second sensor pixel. The system further includes a processor to analyze the full spectrum light and the visible light to determine a depth of the surface. The filter is disposed between the sensor and the surface.

In one or more embodiments, the sensor has a plurality of second sensor pixels including the second sensor pixel, each of the plurality of second sensor pixels is adjacent the first sensor pixel, and the filter allows transmission of visible light to each of the plurality of second sensor pixels while preventing transmission of infrared light to each of the plurality of second sensor pixels. Analyzing the full spectrum light and the visible light may include calculating an estimated visible light value for the first sensor pixel based on a plurality of detected visible light values corresponding to the plurality of second sensor pixels. Calculating the estimated visible light value may include averaging the plurality of detected visible light values. Calculating the estimated visible light value may include performing edge detection on the plurality of detected visible light values.

In one or more embodiments, the sensor has a plurality of first sensor pixels including the first sensor pixel, each of the plurality of first sensor pixels is adjacent the first sensor pixel, and the filter allows transmission of visible light to each of the plurality of second sensor pixels while preventing transmission of infrared light to each of the plurality of second sensor pixels. Analyzing the full spectrum light and the visible light may include calculating a plurality of estimated visible light values for each of the plurality of first sensor pixels, and calculating an estimated visible light value for the first sensor pixel based on at least some of the plurality of estimated visible light values.

In one or more embodiments, the system also includes a spatially modulated light projection device to project the light toward the surface, where the light is reflected from the surface toward the sensor. Analyzing the full spectrum light and the visible light may include generating an infrared light image of the surface. Analyzing the full spectrum light and the visible light may include triangulating a POI in the infrared light image of the surface.

In another embodiment, a depth sensing system includes a spatially modulated light projection device to project light toward a surface. The system also includes a sensor to receive the light reflected from the surface. The system further includes an actuator to control spatial modulation of the light projection device and to receive light information from the sensor. Moreover, the system includes a processor to analyze the light reflected from the surface to determine a depth of the surface. The light includes infrared light having a wavelength from about 700 nm to about 1 mm.

In one or more embodiments, the light includes visible light having a wavelength from about 390 nm to about 700 nm. The actuator may control spatial modulation of the light projection device to form a pattern including the infrared light and the visible light. The actuator may control spatial modulation of the light projection device to form two intersecting line segments on the surface. The actuator may control spatial modulation of the light projection device to form a static pattern including two intersecting line segments on the surface. The actuator may control spatial modulation of the light projection device to form a dynamic pattern including two intersecting line segments on the surface. The actuator may control spatial modulation of the light projection device to form a pattern including a plurality of discrete intersecting line segments on the surface.

In one or more embodiments, controlling spatial modulation of the light projection device includes controlling movement of at least a portion of the light projection device. Controlling spatial modulation of the light projection device may include controlling projection of the light by the light projection device. The spatially modulated light projection device may include a fiber scanned display. The spatially modulated light projection device may include a laser light source. The spatially modulated light projection device may include a laser scanning display.

In still another embodiment, a depth sensing system includes a sensor having first and second sensor pixels to receive light from a surface. The system also includes a filter to allow transmission of a first proportion of visible light and a second proportion of infrared light to the first sensor pixel and a third proportion of visible light and a fourth proportion of infrared light to the second sensor pixel. The first proportion of visible and the second proportion of infrared light result in a first sensed value at the first sensor pixel. The third proportion of visible and the fourth proportion of infrared light result in a second sensed value at the second sensor pixel. The system further includes a processor to analyze the first and second sensed values to determine a depth of the surface. The filter is disposed between the sensor and the surface.

In one or more embodiments, analyzing the first and second sensed values includes generating an infrared light image of the surface. Analyzing the first and second sensed values may include triangulating a POI in the infrared light image of the surface.

Additional and other objects, features, and advantages of the invention are described in the detail description, figures and claims.

BRIEF DESCRIPTION OF THE DRAWINGS

The drawings illustrate the design and utility of various embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 3 and 4 also depict scan areas of various prior art depth sensing systems;

DETAILED DESCRIPTION

Figure 1:
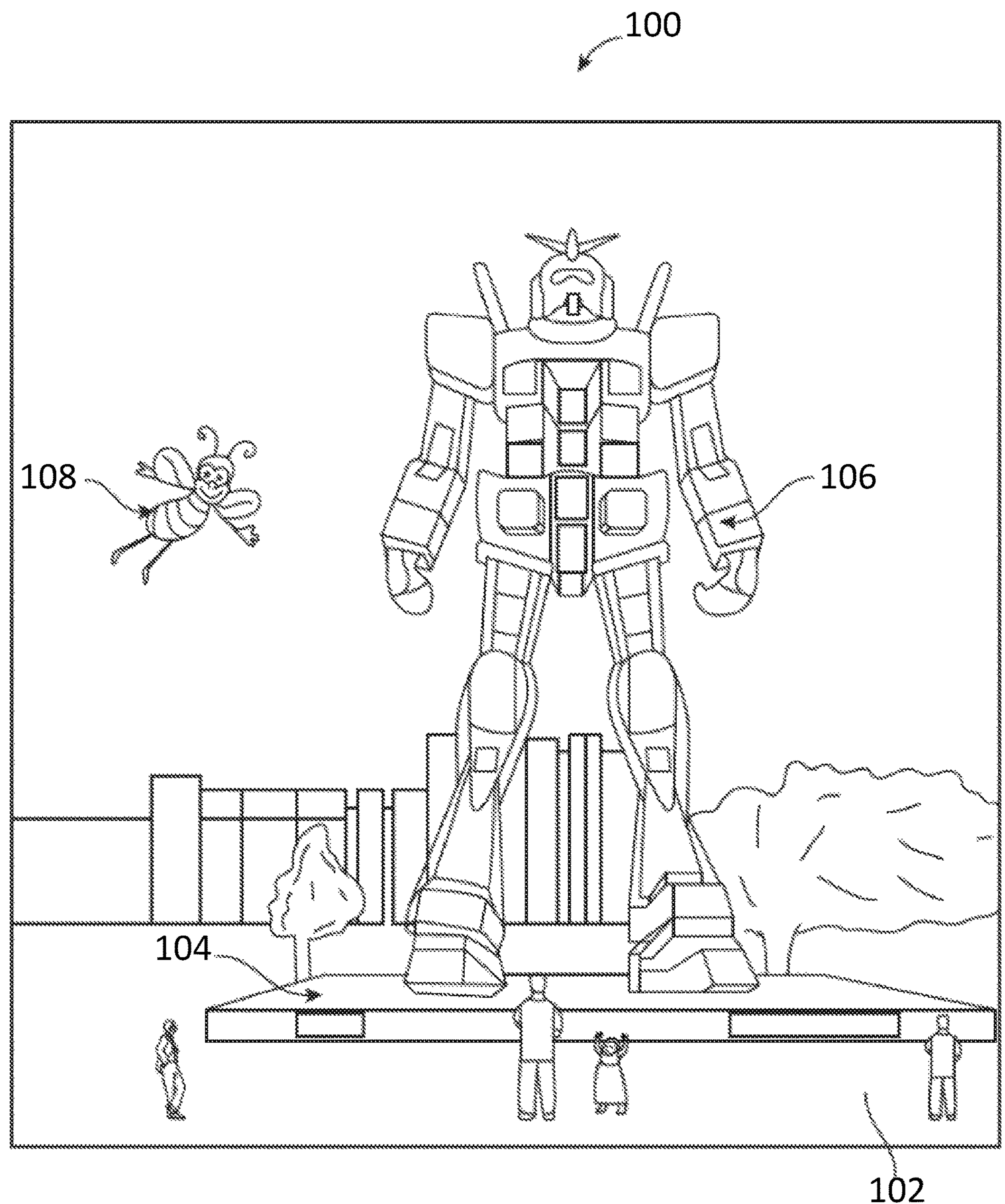
FIG. 1 depicts a user's view of augmented reality (AR) through a wearable AR user device according to one embodiment.

Various embodiments of the invention are directed to systems, methods, and articles of manufacture for depth sensing systems in a single embodiment or in multiple embodiments. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

The depth sensing systems may be implemented independently of mixed reality systems, but many embodiments below are described in relation to AR systems for illustrative purposes only.

SUMMARY OF PROBLEM AND SOLUTION

There are various methods for optically estimating or sensing the depth of a surface (i.e., the distance between a known point in 3D space and a point on the surface). Depth sensing methods can be classified into two primary modes: passive and active. Passive systems detect ambient light from light sources outside of the systems (e.g., overhead lights or the sun) that is reflected by the surface. Active systems project light onto a surface and detect the projected light reflected by the surface.

Passive systems typically determine depth using two images captured at different locations that are separated by a known distance. Some passive systems capture the two images using multiple cameras (as in a binocular configuration). Other passive systems capture the two images using the same sensor at different times and locations. After the two images have been captured at the different locations, the systems process the images to match a POI in one image to the corresponding POI in the other image. Then, the systems triangulate the angles between the optical axes of the two images and a single POI on a surface, and the distance between the two image capture locations to determine the location of the POI in 3D space relative to the two image capture locations, which are known to the system.

Passive systems can determine the location of a POI in 3D space, but have multiple failure modes, including the lack of suitable POIs that can be identified in one image ("identification problem") and matched with their counterparts in the other image ("correspondence problem"). An example of this failure mode is imaging a blank white wall, in which (1) identifying a point on the wall in one image and (2) identifying the corresponding point in the other image are exceedingly difficult. Similarly, in the case of a dark room, there simply isn't enough ambient light to clearly see objects, and thus, identifying and matching them is also exceedingly difficult.

Some active systems address these two problems (i.e., lack of light and lack of distinguishable features) by projecting patterned or textured light (e.g., light from a kaleidoscope). Such systems illuminate the surface and project a pattern over a homogenous surface (e.g., a white wall). When two images are captured using such active systems with a static illumination pattern (by either simultaneous capture or two cameras with stationary projection), it is much simpler to match patterns (or portions thereof) on the surface from one image to the other. Therefore, triangulating the location of POIs in 3D space is correspondingly simpler. In fact, using an advanced system with tight mechanical tolerances, a single image captured by a single camera can be used to determine the location of POIs, because the location of the POI in 3D space can be calculated by triangulating both the angle of the observed reflection and the locations of the camera and the light projector.

However, even with active systems, the use of visible light is often suboptimal, because it can be distracting or disorienting to users or others near the surface. Some active systems address this problem by projecting infrared ("IR") light, which modern raw camera sensors can detect (e.g., near-infrared photons), but the human eye cannot see.

Even using infrared active systems, other patterns in the scene may interfere with the depth sensing or causes other depth sensing problems. Other systems include a wavelength filter disposed over the sensor (which natively can sense both visible and infrared light), such that visible light does not reach the sensor. Adding the filter results in detection of an infrared-only image, which is typically only illuminated by the system (infrared) projector, the sun and a few other sources of infrared light (e.g., warm light bulbs and remote controls).

To obtain the most accurate (i.e., closest to the true value) and precise (i.e., reproducible) depth information, a very high resolution sensor is desired. Greater numbers of sensor pixels over the viewing area results in a reduction in the angular resolution of each sensor pixel, effectively providing a higher precision angular input into the triangulation mathematics. As used in this application, "sensor pixel" includes, but is not limited to, distinguishable points on a sensor for measurement of light intensity.

Infrared active systems require sensors/sensor pixels that detect infrared light in addition to sensors/sensor pixels that detect visible light in systems including outwardly directed cameras. Problems with this approach include (1) reduction of visible light resolution in systems including hybrid red/green/blue/infrared sensors and (2) coordinate registration in system including separate visible and infrared sensors. The embodiments disclosed herein address these and other sensor problems by using an improved image sensor with augmented depth sensing, as described below.

Without additional processing, the maximal angular precision for a POI is achieved with an angular resolution of a single sensor pixel. However, image processing algorithms can provide "subpixel resolution." For instance, the system can observe some features (e.g., lines making up the corner edge of a desk) over the course of several sensor pixels, and reconstruct the equation of the line at a precision higher than that of a single sensor pixel.

Depth sensing methods are subject to the Nyquist limits of the systems because they are signal processing methods. As such, a minimum amount of sampling points (and point density) based on the signal frequency is required to reconstruct a signal. Therefore, noisier signals are harder to sample and reconstruct than "simpler" (lower bandwidth) signals. The embodiments disclosed herein address the Nyquist limit associated problems and other projector related problems by using a non-aliasing pattern projector/generator to reduce the high frequency noise of the projected light, as described below.

Dynamic Non-Aliasing Pattern Projector/Generator

Fiber Scan Projectors ("FSP") project light by selectively vibrating a fiber-optic tip at high frequencies. FSP are also known as fiber scanned displays ("FSD"), fiber scanning displays ("FSD"), scanned fiber displays and scanning fiber displays. FSPs can project a dynamic image as a display for human observation. Their exceedingly small size and low potential power consumption are ideal for certain applications such as mixed reality systems. Exemplary FSPs are described in U.S. Utility patent application Ser. Nos. 14/738,877 and 14/555,585, the contents of which have been previously incorporated-by-reference herein.

The embodiments disclosed herein describe projecting textured, patterned, or structured light with an FSP for use in depth reconstruction, as opposed to a typical "panel" type display (e.g., LCOS or DLP). The vast majority of existing active depth sensing systems use photon sources such as LCOS and DLP, which project light with pixelated patterns (e.g., squares or rectangles). These systems illuminate the entire frame simultaneously, and the image projected is composed of multiple rectilinear (or fixed shape) display pixels projected at once. As a result, these images are composed of a plurality of repeated (generally rectilinear/square) shapes instead of clean lines.

Figure 2:
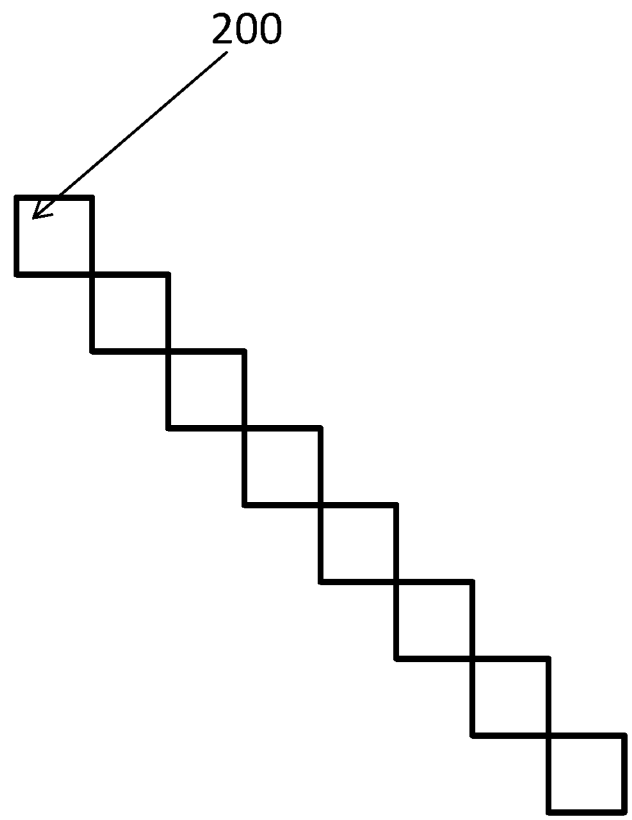
FIGS. 2 to 4 are detailed views of line segments and patterns projected by various prior art depth sensing systems.

FIG. 2 depicts a "line" 200 projected by a panel type display at a magnification sufficient to show imperfections in the projected line 200. At this magnification, the projected line 200 appears as a series of right angles forming a set of steps. However, at lower magnifications, the projected line 200 would appear linear to a viewer. Each of the arms of the right angles is formed by a linear series of display pixels.

Figure 3:
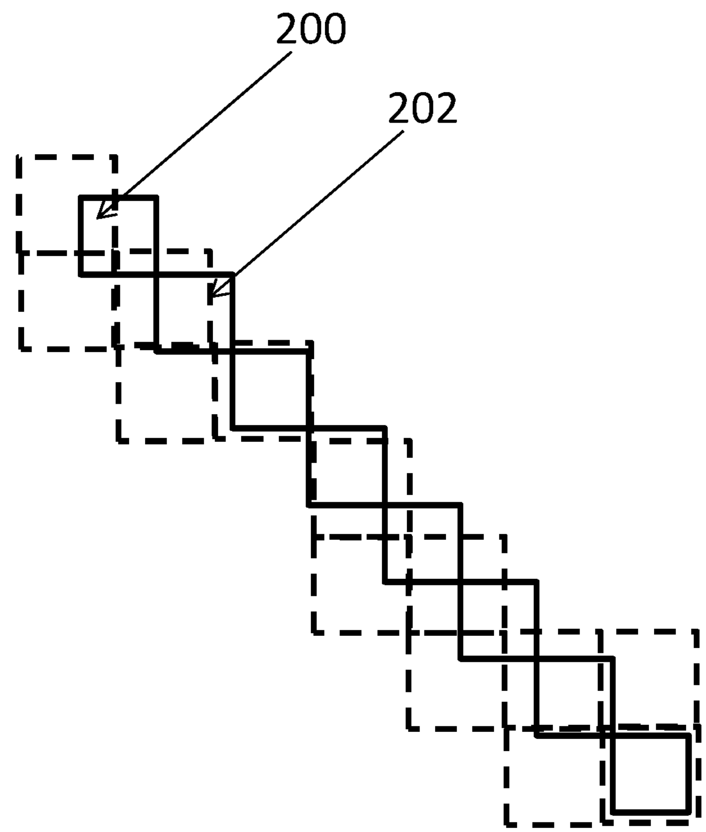

As a result of the irregularities of the projected line 200, a sensor of comparable (or higher) resolution detecting the projected line 200 will have sufficient sensitivity to observe high frequency noise in the projected patterns, complicating the image reconstruction efforts. FIG. 3 shows the projected line 200 from FIG. 2 with overlaid square-shaped scan areas 202 from a sensor with lower resolution than the projector. As shown in FIG. 3, the scan areas 202 along the projected line 200 do not contain identical amounts of the projected line 200. Therefore, the signal from the sensor is very noisy, resulting in aliasing, i.e., a wide grey line instead of a narrow black line.

Figure 4:
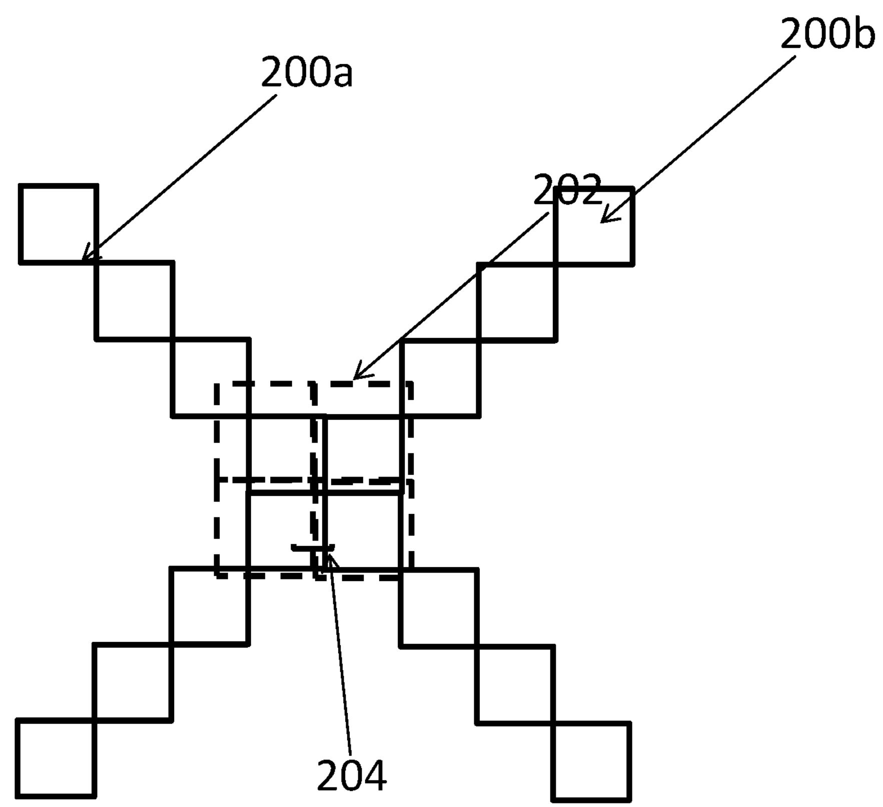

This noisy signal problem complicates the task of locating the intersection 204 of two projected lines 200*a*, 200*b*, as shown in FIG. 4. This intersection 204 may be a POI for a depth sensing system. However, the high frequency noise in the projected lines 200*a*, 200*b* results in the intersection 204 being a line segment instead of a point. Further, the scan areas 202 are not capable of resolving the lines 200*a*, 200*b* in sufficient detail to identify the intersection 204 at a high accuracy.

Existing systems address this problem either by using a projector with much higher resolution than the corresponding sensor, or by using additional signal processing algorithms to reconstruct this noisier signal back into something suitable for sub-pixel (or even at-pixel) precision mapping.

The embodiments disclosed herein describe projecting light using a FSP to produce a higher quality dynamic pattern to facilitate image reconstruction. When using FSPs, light is projected by a single traveling beam (e.g., a laser). The beam is mechanically scanned across the scene at relatively high frequencies. Rather than projecting light onto substantially every pixel of the scene (as with panel type displays), FSPs create optically distinct patterns by projecting beam-patterns with narrow dispersion angles onto the surface, such that the light projected minimizes aliasing (e.g., image warping or jaggies) and high-frequency noise, both of which interfere with reconstruction efforts.

Whereas panel type displays have fixed illumination patterns, FSPs are dynamic. While the effective scan frequency of the FSP might allow only 200 separate X and Y travel paths (for example), the phase-offset, illumination pattern, and scan frequency can be varied, allowing a dynamic pattern that provides clear non-aliasing edges, intersections, and thus easily identifiable POIs, without requiring an extremely high resolution projector.

Figure 5:
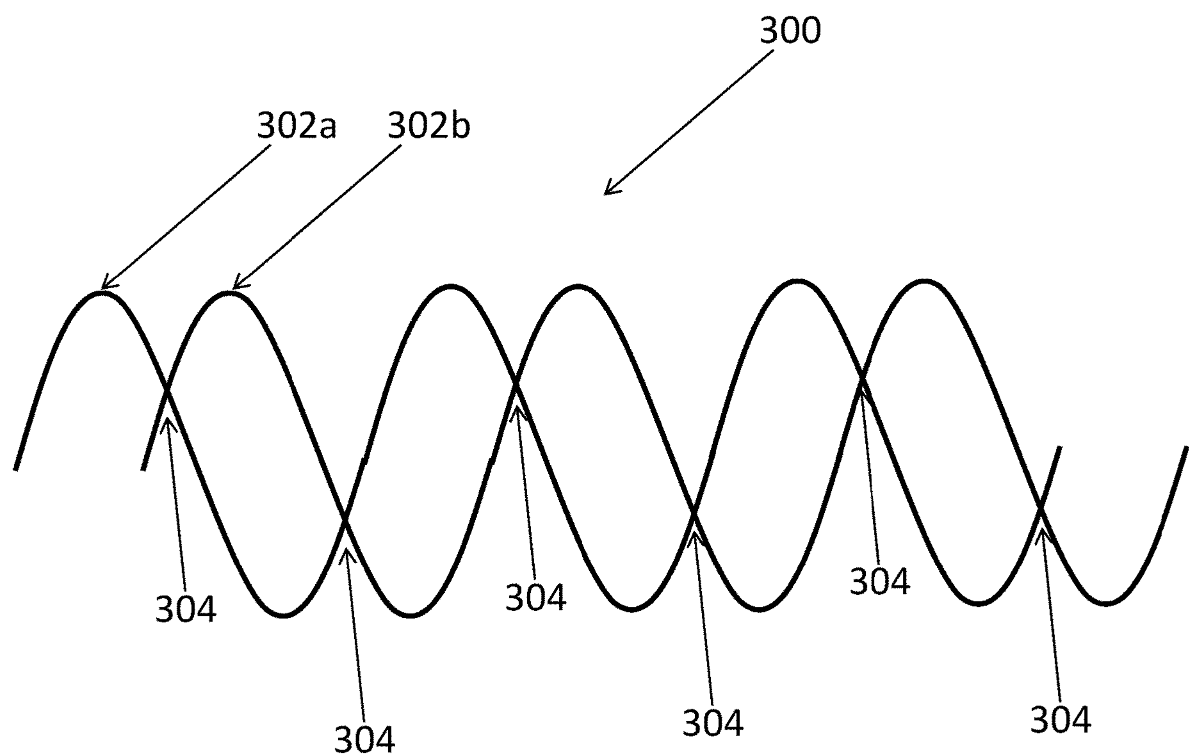
FIGS. 5 to 9 are detailed views of line segments and patterns projected by depth sensing systems according to various embodiments.

For instance, FIG. 5 depicts a pattern 300 projected by an FSP. The pattern is made by modulating the FSP (e.g., with an actuator) to "draw" two instances/passes of a sin wave 302*a*, 302*b* that are phase-offset. As such, the first and second sin waves 302*a*, 302*b* intersect periodically, forming a regular set of intersections 304. The FSP may project light from a tight beam light source (e.g., a laser) to form the pattern 300 depicted in FIG. 5. Accordingly, the signal from the light has minimal high frequency noise and negligible aliasing. The intersections 304 form particularly desirable POIs because intersections are more accurately and precisely identifiable by image analysis than points, which will increase in diameter as light spreads, requiring estimation of the center of the point. Another FSP pattern that form discrete intersections is the Lissajous pattern.

Figure 6:
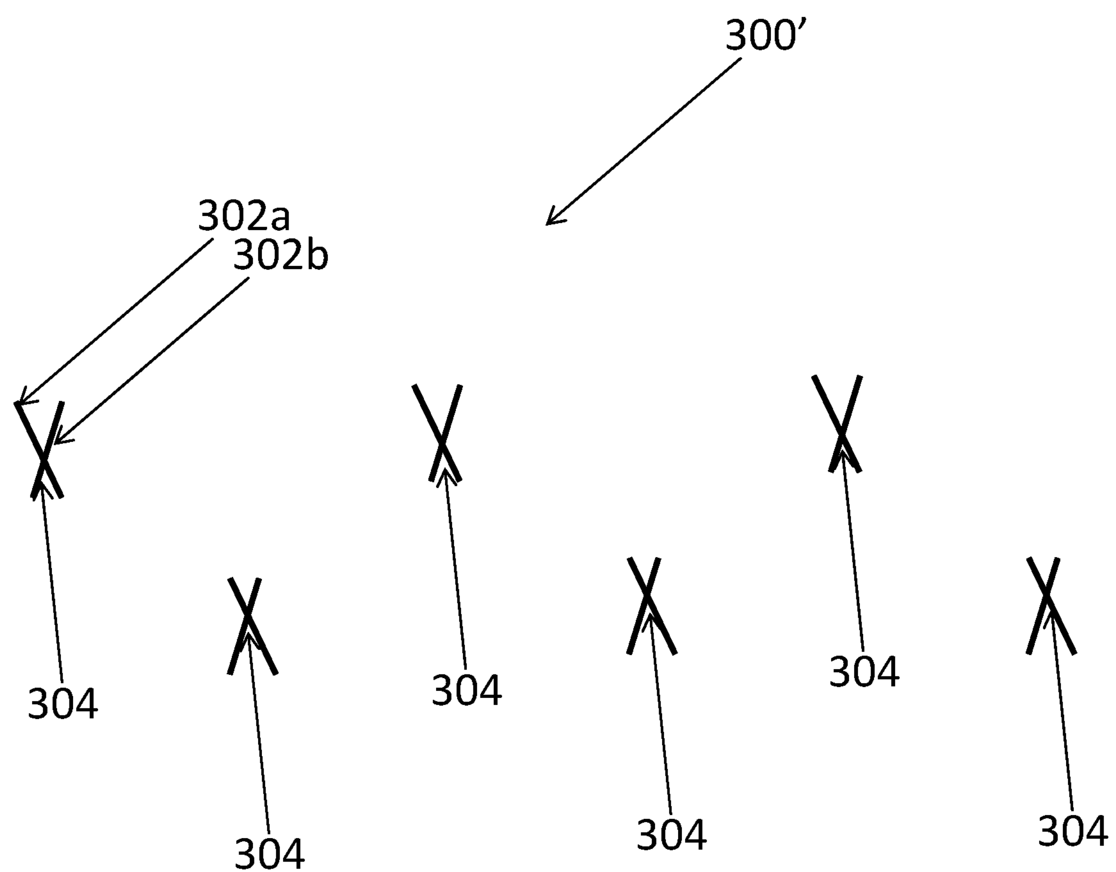

FIG. 6 depicts another pattern 300' projected by an FSP. The pattern 300' depicted in FIG. 6 is similar to the pattern 300 depicted in FIG. 5 and described above. In fact, the pattern 300' depicted in FIG. 6 is formed by modulating the FSP to form the exact same first and second sin waves 302*a*, 302*b* shown in FIG. 5. However, the FSP is further modulated by activating the light source therein only when the first and second sin waves 302*a*, 302*b* cross to form intersections 304. Projecting this pattern 300' with an FSP results in (1) more distinctive and identifiable intersections 304 (POIs) and (2) reduced system energy usage from deactivating the light source.

Figure 7:
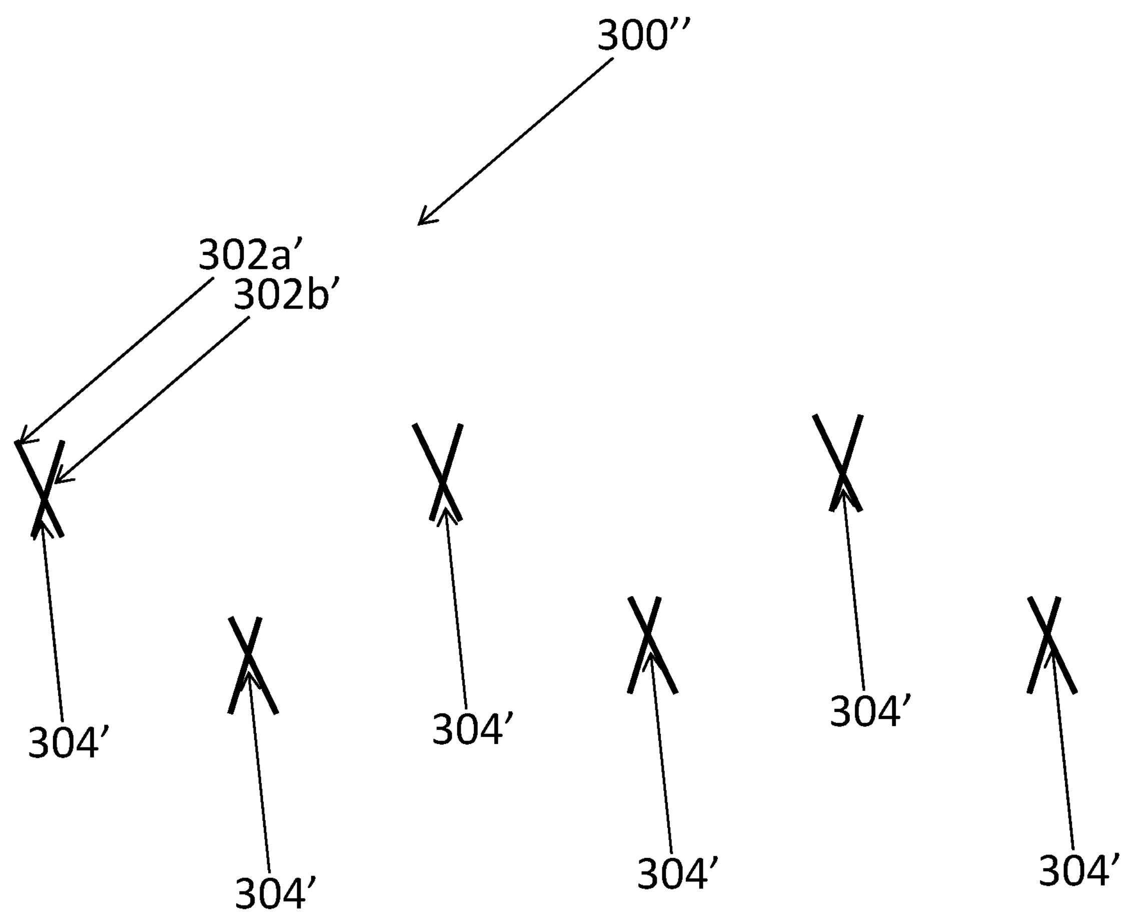

FIG. 7 depicts still another pattern 300" projected by an FSP. The pattern 300" depicted in FIG. 7 is almost identical to the pattern 300' depicted in FIG. 6 and described above. The first and second sin waves 302*a*', 302*b*' shown in FIG. 7 are phase shifted (by the same amount) compared to the first and second sin waves 302*a*, 302*b* shown in FIG. 6. Accordingly, the intersections 304' formed by the first and second sin waves 302*a*', 302*b*' shown in FIG. 7 are also phase shifted compared to intersections 304 formed by the first and second sin waves 302*a*, 302*b* shown in FIG. 6.

Figure 8:
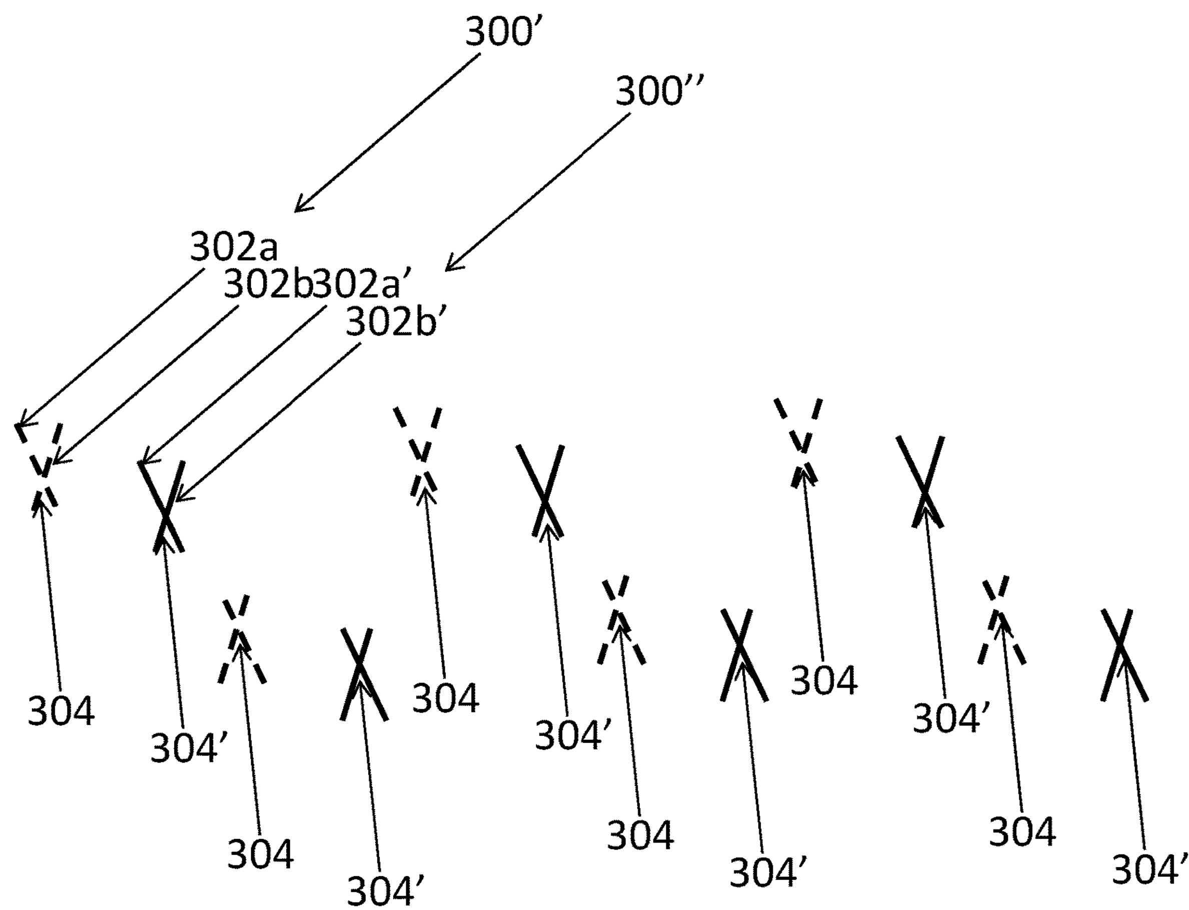

The displacement of the intersections 304' compared to the intersection 304 is depicted in FIG. 8, which is FIG. 7 with the first and second sin waves 302*a*, 302*b* and the intersections 304 (from FIG. 6) shown in shadow. Time sequentially switching between the pattern 300' depicted in FIG. 6 (and in shadow in FIG. 8) and the pattern 300" depicted in FIG. 7 (and in solid in FIG. 8) causes the intersections 304/304' to appear to move. This movement results in a dynamic pattern with more distinctive and identifiable intersections 304/304' (POIs).

Figure 9:
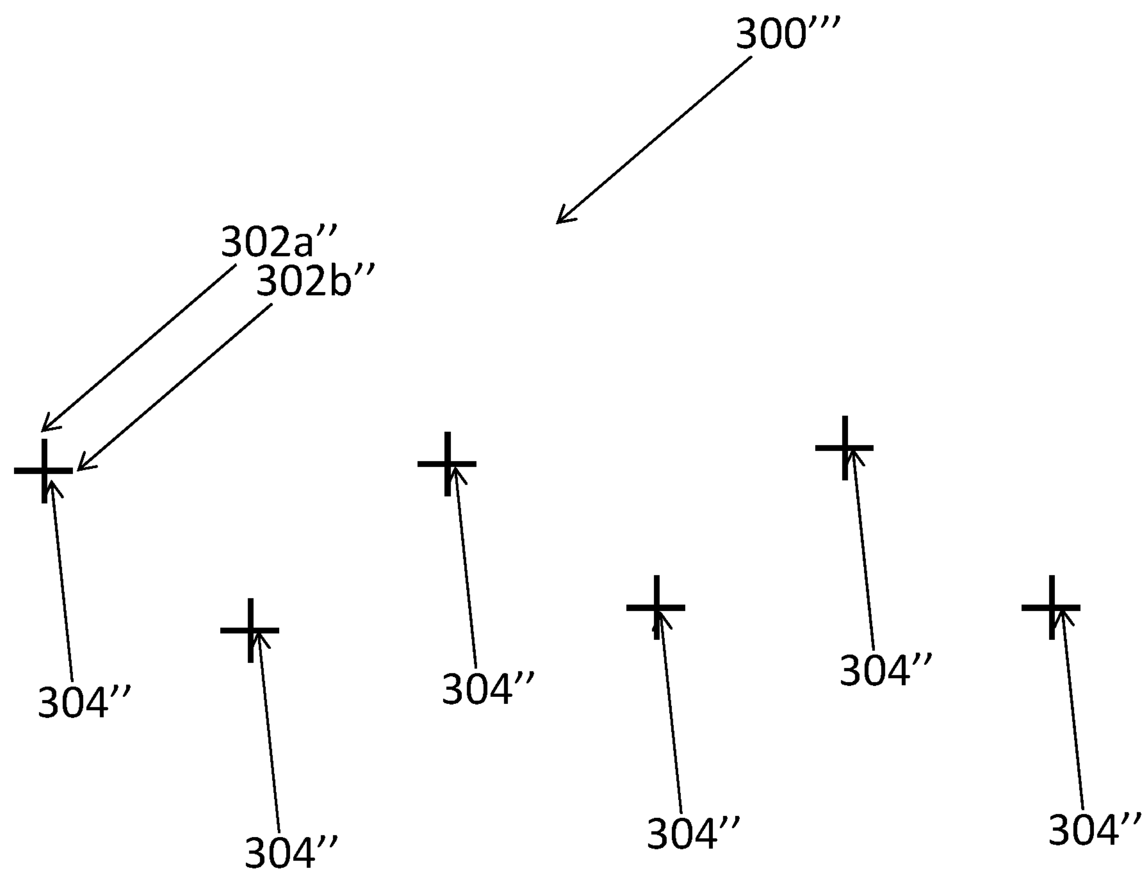

FIG. 9 depicts another pattern 300''' projected by an FSP. The pattern 300''' depicted in FIG. 9 is similar to the pattern 300 depicted in FIG. 6 and described above. The first and second sin waves 302*a*", 302*b*" shown in FIG. 9 are modified compared to the first and second sin waves 302*a*, 302*b* shown in FIG. 6. Accordingly, the intersections 304" formed by the first and second sin waves 302*a*", 302*b*" shown in FIG. 9 have a modified shape compared the intersections 304 formed by the first and second sin waves 302*a*, 302*b* shown in FIG. 6. The shape of the intersections 304" in FIG. 9 are +'s, whereas the shape of the intersections 304 in FIG. 6 are X's. However, the locations of the intersections 304, 304" in FIGS. 6 and 9 are the same. Accordingly, time sequentially switching between the pattern 300' depicted in FIG. 6 and the pattern 300''' depicted in FIG. 9 causes the intersections 304/304" to appear to change shape (between X's and +'s). This shape change results in a dynamic pattern with more distinctive and identifiable intersections 304/304" (POIs).

The patterns 300, 300', 300", 300''' depicted in FIGS. 5-9 depict the same change to each intersection 304, 304', 304" (POI) in the patterns 300, 300', 300", 300'''. In other embodiments, a subset of the intersections 304, 304', 304" may change (e.g., position, shape, wavelength, etc.). In still other embodiments various subsets of the intersections 304, 304', 304" may have different changes. For instance, only the intersection(s) 304, 304', 304" being used for depth sensing may change. In other embodiments, the number of intersections 304, 304', 304" may change dynamically from dense to sparse. In still other embodiments, the light source (e.g., laser) can be pulsed to dynamically vary the patterns 300, 300', 300", 300'''.

Figure 10:
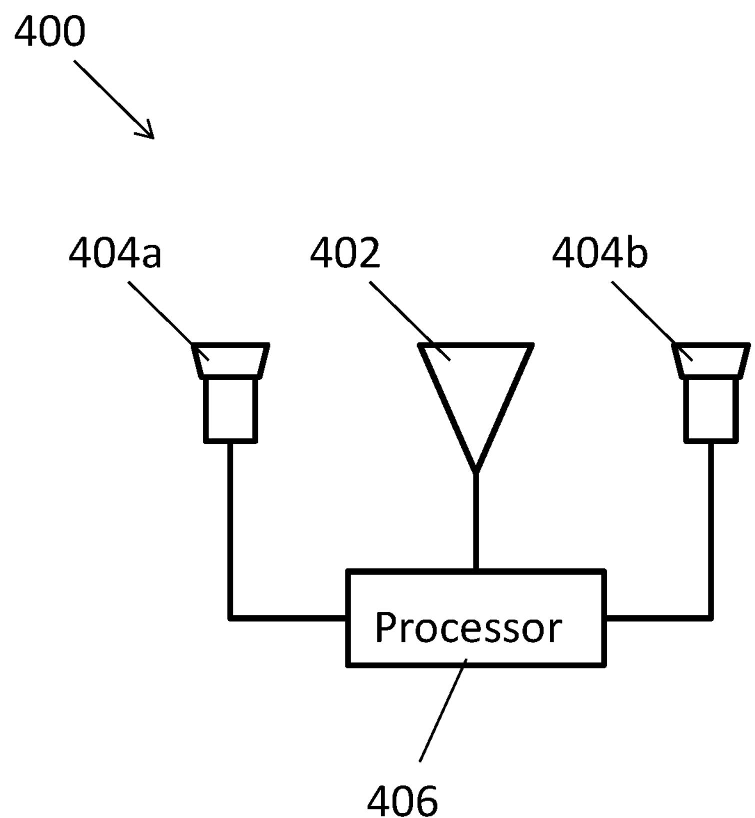
FIG. 10 is a detailed schematic view of a depth sensing system according to one embodiment.

FIG. 10 depicts an active depth sensing system 400 capable of projecting the patterns 300, 300', 300" described above according to one embodiment. The system 400 includes a spatially modulated light projection device 402 (e.g., an FSP), two light sensors 404*a*, 404*b* (e.g., cameras), and a processor 406 operatively coupled to the other components 402, 404*a*, 404*b*. The spatially modulated light projection device 402 (e.g., an FSP), the light sensors 404*a*, 404*b* (e.g., cameras), and the processor 406 may be coupled by a bus (not shown) in the system 400. Alternatively, some or all of these components 402, 404*a*, 404*b*, 406 may be coupled to each other by a network (e.g., a wireless network).

Figure 11:
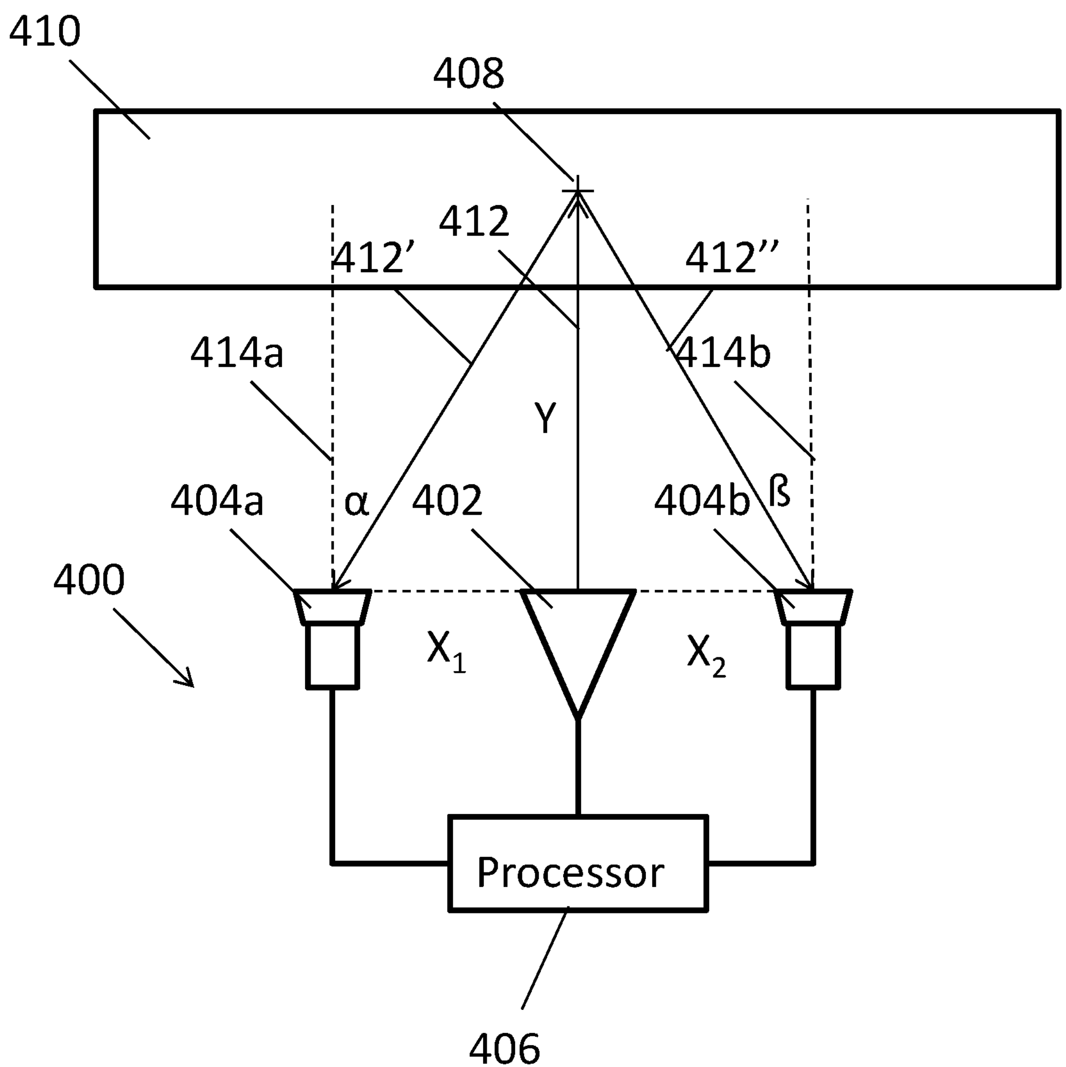
FIG. 11 is a detailed perspective view of the depth sensing system depicted in FIG. 10 in use.

FIG. 11 depicts the active depth sensing system 400 depicted in FIG. 10 in use. The spatially modulated light projection device 402 is modulated to project a pattern 408 (e.g., +) onto a substantially homogenous surface 410 (e.g., a blank wall). The pattern 408 can be used as a POI to determine the distance Y between the light projection device 402 and the surface 410. The light projection device 402 projects light 412 onto the surface 410 to form the pattern 408. Reflect light 412', 412" is detected from the first and second light sensors 404*a*, 404*b*.

The system 400 measures angles α, β by which the pattern 408 is displaced from the respective optical axes 414*a*, 414*b* of the first and second light sensors 404*a*, 404*b*. Using one of the measured angles α, β and the known distances $X_1$, $X_2$ separating the light projection device 402 and respective first and second light sensors 404*a*, 404*b*, the system 400 can calculate the distance Y between the light projection device 402 and the surface 410. Having measured angles α, β, the system 400 can provide a more accurately and precisely calculated distance Y.

Figure 12:
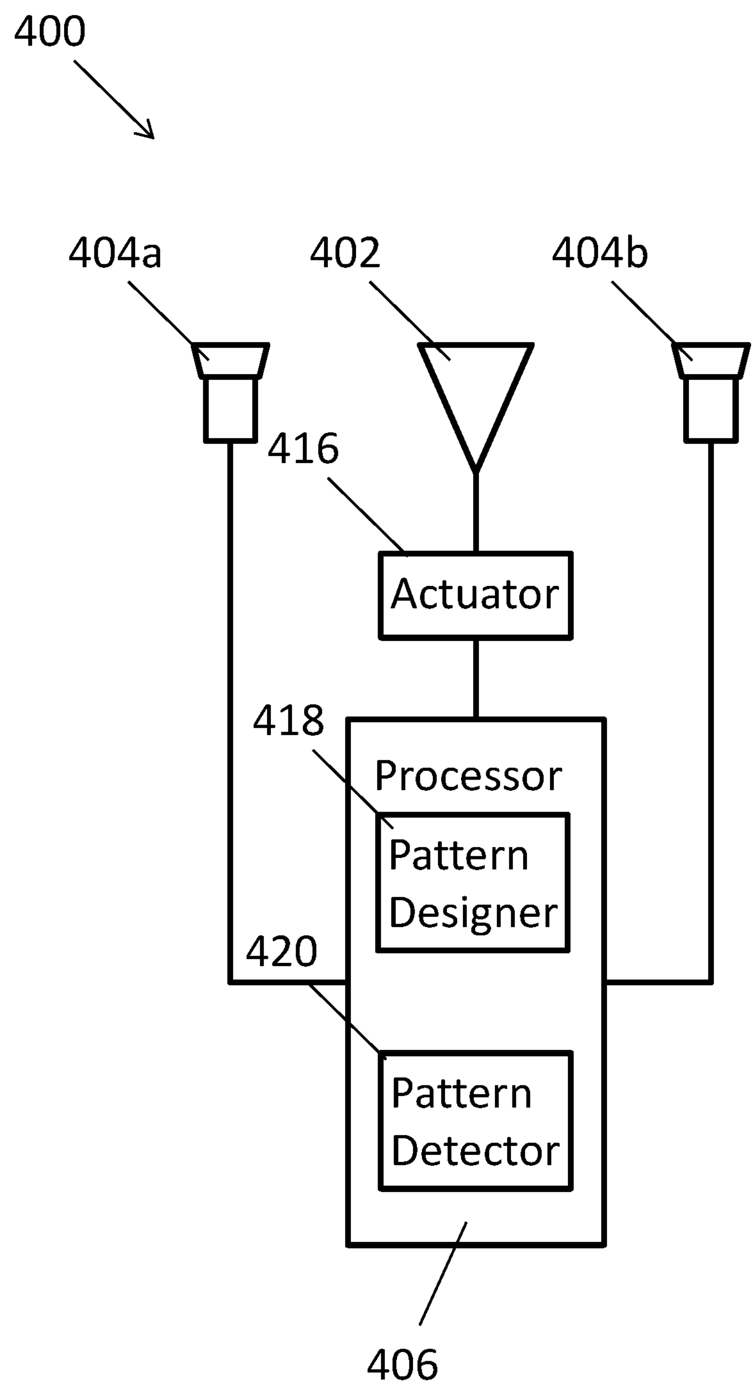
FIG. 12 is a detailed schematic view of a depth sensing system according to another embodiment.

FIG. 12 depicts an active depth sensing system 400 according to another embodiment. The system 400 depicted in FIG. 12 is similar to the one depicted in FIGS. 10 and 11. In addition to the spatially modulated light projection device 402, the two light sensors 404*a*, 404*b* and the processor 406, the system 400 depicted in FIG. 12 also includes an actuator 416 to modulate the light projection device 402. The processor 406 of the system 400 depicted in FIG. 12 includes a pattern designer 418 and a pattern detector 420 running thereon. The pattern designer 418 generates patterns and sends data specifying the generated patterns to the actuator 416, which modulates the light projection device 402 to display the generated patterns. The pattern detector 420 receives optical data from the first and second light sensors 404*a*, 404*b* and extracts information regarding the pattern from the received optical data.

Further, because the FSP simply acts as a spatially modulated conduit for light beams, light beams having different wavelengths can be passed down the FSP simultaneously. This allows not only invisible infrared light to be transmitted, but also visible light of various colors. Using multiple light beams allows the FSP to augment an infrared pattern with a visible pattern, allowing correspondence between camera sensors that might not normally be able to see in similar wavelengths. This can aid in registration of the camera sensors to a common coordinate system, provide additional depth reconstruction information (allowing features from one sensor to help provide supplemental information to another sensor). Such a system can also perform other function, such as assistive illumination to indicate a goal, a region for use in focusing, a warning, etc.

Active depth sensing systems including an FSP have the following characteristics. FSPs project distinctive and dynamic (i.e., varying over time) patterns, providing supplemental or improved information for depth determination over time. Further, FSPs can tailor energy emission to a focused area, thereby reducing power, and increasing energy delivered to a given area to overcome high frequency noise. FSPs also have minimal amounts of high frequency image noise, thereby simplifying depth determination calculations. Moreover, FSPs are able to simultaneously project light from two light sources (e.g., infrared and invisible light sources).

Further, while the active depth sensing systems described herein include FSPs, other spatially modulated light projection devices can also be used in active depth sensing system while retaining the desirable system characteristics. For instance, active depth sensing system can include a micro-electro-mechanical systems ("MEMS") mirror scanner and a laser light source. Like systems including FSPs, a system including a MEMS mirror scanner can project and scan a beam pattern over a surface. In other embodiments, the system can also project and scan a pattern to form a portion of a variably-illuminated computer generated hologram. All spatially modulated light projection devices (e.g., FSPs and MEMS mirror scanners) project "beams" or "arcs" of light rather than display pixels, and have the ability to vary the path and timing of those beams.

Image Sensor with Augmented Depth Sensing

Both passive and active depth sensing systems include at least one sensor (e.g., a camera) to detect light reflected from a surface. As described above, some depth sensing systems detect visible light (e.g., ambient light), while others detect projected light patterns (e.g., projected infrared light).

Figure 13:
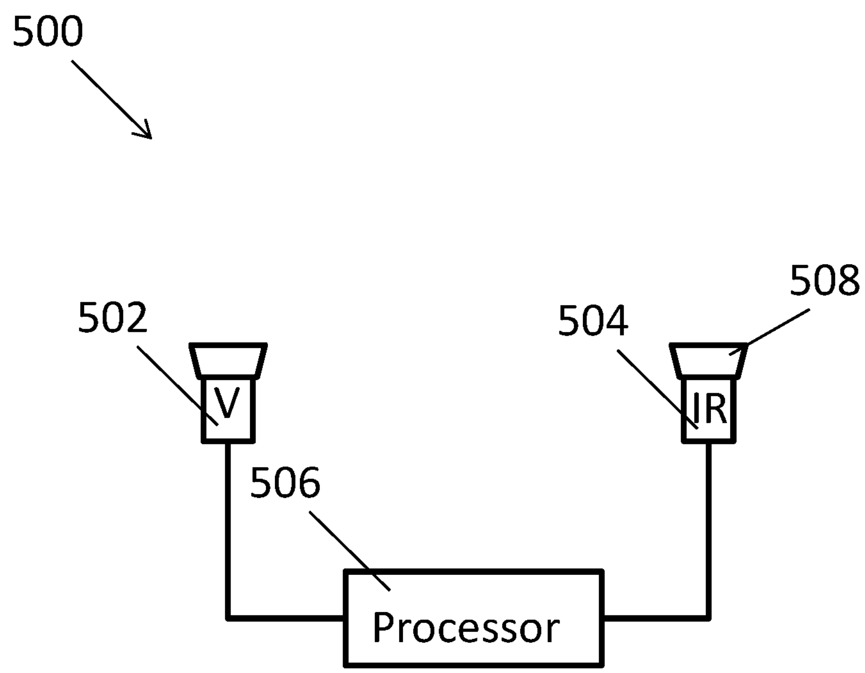
FIG. 13 is a detailed schematic view of a prior art depth sensing system.

Existing depth sensing systems (passive and active) typically use two camera sensors to detect visible and projected infrared light. These camera sensors are each associated with different filters, such that one camera sensor detects visible light (possibly with an RGB color filter), and the other camera sensor detects infrared light (by filtering out visible light). This sensor arrangement is depicted in FIG. 13, which depicts a passive depth sensing system 500 including a visible light sensor 502 and an infrared light sensor 504, both operatively coupled to a processor 506. The infrared light sensor 504 includes a light cut filter 508, which prevents all light except infrared light from reaching the infrared light sensor 504. Before data from the visible light and infrared light sensors 502, 504 can be used together, the coordinate systems of the sensors 502, 504 must be registered. Registration of the coordinate systems is especially difficult when the depth sensing system 500 is moving relative to the surface.

Figure 14:
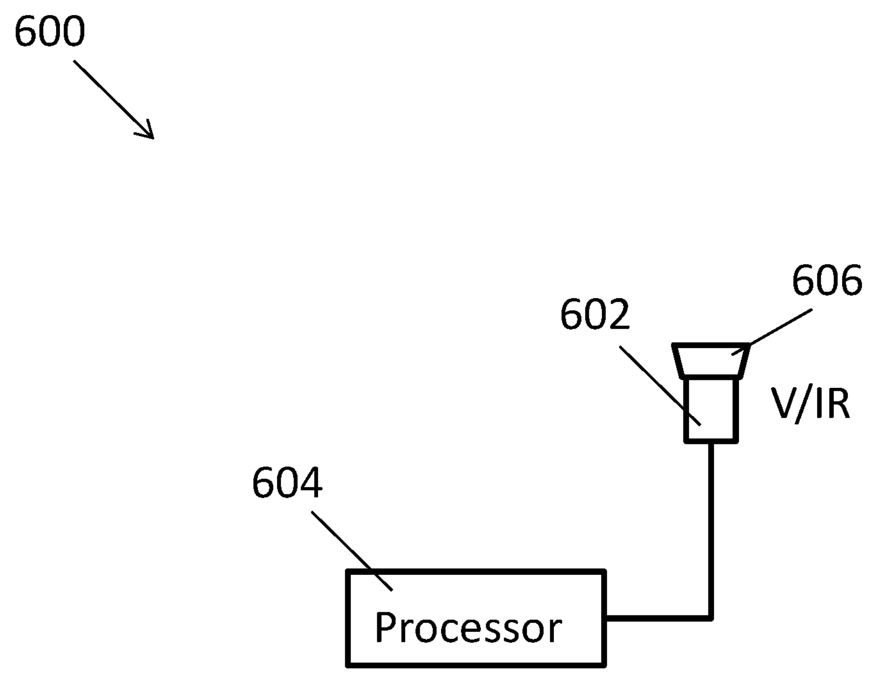
FIGS. 14 and 15 are detailed schematic views of depth sensing systems according to two embodiments.

The embodiments disclosed herein describe a hybrid visible/full spectrum light sensor for use in depth sensing systems. As used in this application, "full spectrum light," includes visible and infrared light (wavelengths from about 390 nm to about 1 mm). For instance, FIG. 14 depicts a passive depth sensing system 600 according to one embodiment. The passive depth sensing system 600 includes a hybrid visible/full spectrum light sensor 602 operatively coupled to a processor 604. The visible/full spectrum light sensor 602 includes a hybrid filter 606, as described in detail below. The hybrid filter 606 allows only visible light to reach some portions (i.e., sensor pixels) of the visible/full spectrum light sensor 602, but allows full spectrum light to reach other portions (i.e., sensor pixels) of the visible/full spectrum light sensor 602.

Figure 15:
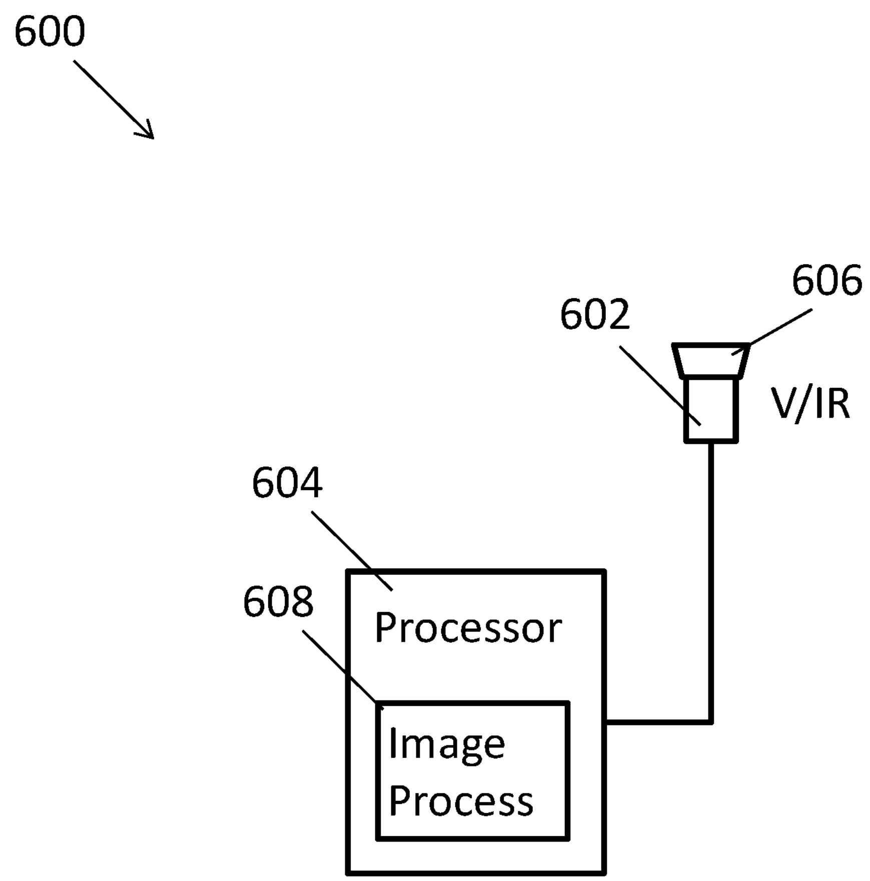

FIG. 15 a passive depth sensing system 600 according to another embodiment. The passive depth sensing system 600 includes a hybrid visible/full spectrum light sensor 602 operatively coupled to a processor 604. The visible/full spectrum light sensor 602 includes a hybrid filter 606, as described in detail below. The processor 604 includes an image processor 608 running thereon.

Figure 16:
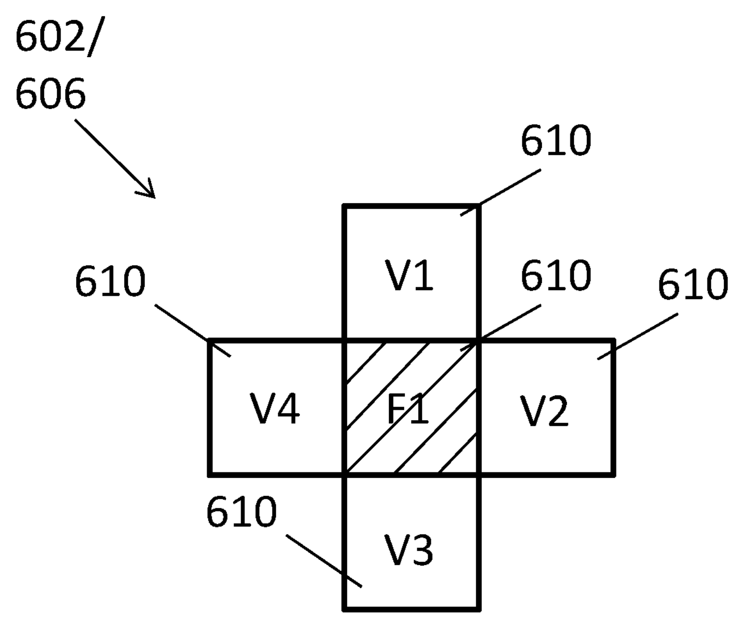
FIGS. 16-18 are detailed schematic views of a light sensor for depth sensing systems according to various embodiments.

FIG. 16 schematically depicts a portion of a hybrid visible/full spectrum light sensor 602 and its hybrid filter 606 for use in the passive depth sensing systems 600 like those depicted in FIGS. 14 and 15. The portion of the hybrid visible/full spectrum light sensor 602 depicted in FIG. 16 include five sensor pixels 610. The underlying sensor pixels 610 are identical in so far as they can each detect full spectrum light, i.e., visible light (wavelengths from about 390 nm to about 700 nm) and infrared light (wavelengths from about 700 nm to about 1 mm). However, the light reaching some sensor pixels 610 is modified by the filter 606 disposed between a light source (e.g., a reflecting surface) and the sensor 602.

As shown in FIG. 16, the filter 606 includes sub-filters or "caps" F1 and V1-V4 disposed over corresponding sensor pixels 610. Full spectrum light ("F-type") caps allow full spectrum light to reach the sensor pixel 610 underlying the F-type caps. In fact, F-type caps may not have any filtering ability at all. Visible light ("V-type") caps allow only visible light to reach the sensor pixel 610 underlying the V-type caps. Sensor pixel/cap 610F1 is surrounded by four sensor pixels/caps 610V1-610V4 at cardinal positions, forming a "+" sign with sensor pixel/cap 610F1 in the middle. Accordingly, the hybrid visible/full spectrum light sensor 602 includes a full spectrum light ("F-type") sensor pixel surrounded by four visible light ("V-type") sensor pixels in cardinal positions relative to the full spectrum light sensor pixel. The hybrid visible/full spectrum light sensor 602 is different from other sensors because of the combination of visible and full spectrum light sensors pixels in one sensor and the arrangement of those sensor pixels.

While the sensor 602 and filter 606 depicted in FIG. 16 includes five sensor pixels 610 arranged in a cross-shaped configuration, other embodiments include configurations with different numbers of pixel and/or different shapes. The sensor data analysis methods described herein can be modified to analyze data from sensors and filters with different configurations.

Figure 17:
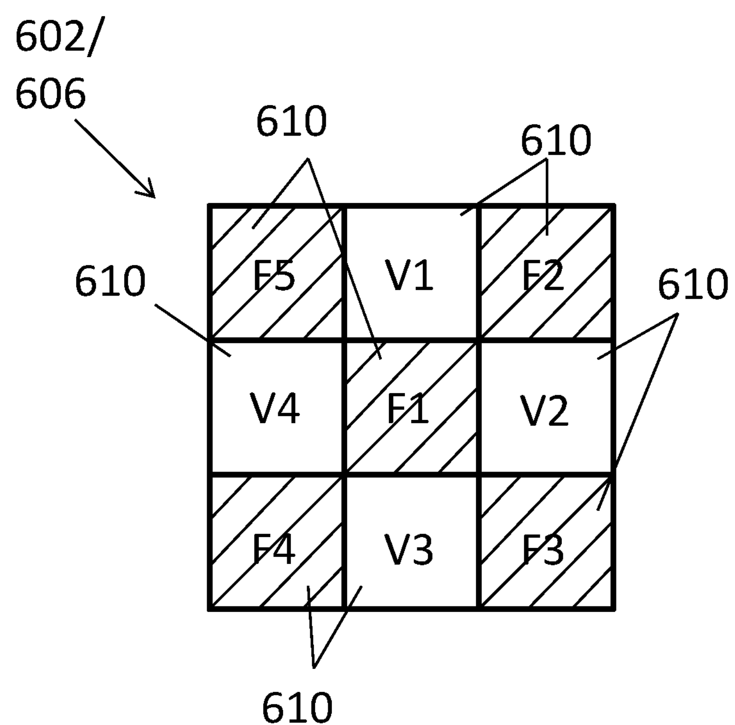
Figure 18:
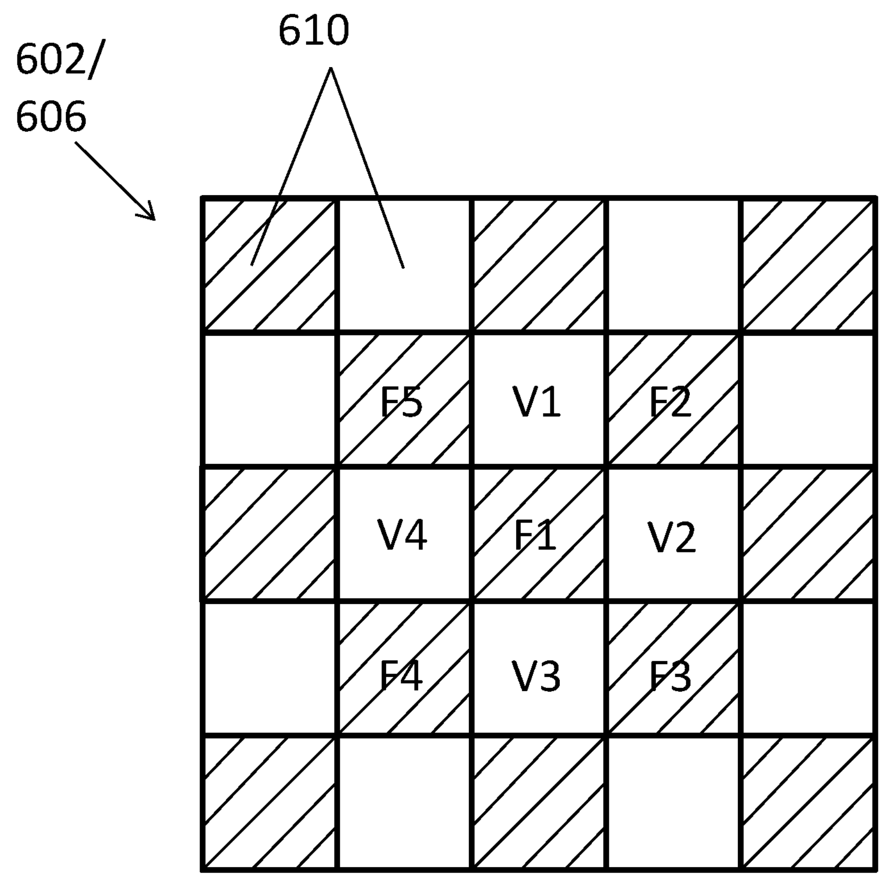

FIGS. 17 and 18 schematically depict larger portions of the hybrid visible/full spectrum light sensor 602 depicted in FIG. 16 and its hybrid filter 606. As shown in FIGS. 17 and 18, V-type and F-type sensor pixels are disposed in an alternating pattern, such that for each sensor pixel (V-type or F-type), all four of its cardinal neighbors are of the complementary type.

In such a configuration, for a hybrid visible/full spectrum light sensor 602 with P total sensor pixels (e.g. 640×480=307,200), half of the sensor pixels would be V-type, and half would be F-type. When each type of sensor pixel is considered independently without further image processing, this sensor pixel arrangement results in reduced effective resolution for sensor pixel type and application. Increasing the overall resolution sensor to compensate for this problem would increase power consumption, sensor size, and other system costs.

Depth sensing systems 600 including hybrid visible/full spectrum light sensors 602 according to various embodiments compensate for reduced effective resolution by image processing (using the image processor 608 depicted in FIG. 15). While these methods may not recover 100% of the resolution of a separate visible or infrared sensor of comparable size, these methods can recover effectively higher resolution that would be expected from the actual sensor pixel resolution of the hybrid visible/full spectrum light sensor 602 (e.g., 50% visible sensor pixels and 50% full spectrum sensor pixels). Embodiments of image processing methods for use with hybrid visible/full spectrum light sensors can recover from about 50% to about 100% of the resolution of separate sensors. Other embodiments can recover about 66% to about 90% of the resolution. Still other embodiments can recover about 75% of the resolution.

The light used in the depth sensing system 600 includes wavelengths that overlap in the visible spectrum because all sensor pixels 610 detect visible light. F-type sensor pixels 610F also detect infrared light. In the embodiment shown in FIGS. 16-18, each sensor pixel 610 has eight adjoining neighbors, four of each type. For example, as shown in FIG. 17, 610F1 has four adjoining V-type sensor pixels 610V1-610V4 in the cardinal directions. 610F1 also has four adjoining F-type sensor pixels 610F2-610F5 in the intercardinal directions.

The following is a general description of an image processing method according to one embodiment. The F value of all F-type sensor pixels 610F can be initially approximated as being comprised of two values—a calculated visible value ("CV"), and a calculated infrared value ("CI"). In a first pass, the measured visible light values ("V") for the V-type sensor pixels 610V adjacent a F-type sensor pixel 610F are used to estimate a first pass CV for the F-type sensor pixel 610F. Then the first pass CV is used to estimate a first pass CI for the F-type sensor pixel 610F. In a second pass, the first pass CI is used to (more accurately) estimate a second pass CV for the F-type sensor pixel 610F.

For surfaces with substantially homogenous or well-understood CIs, the second pass CV can be estimated by subtracting the first pass CI from F for the F-type sensor pixel 610F, thereby providing information not available from the V-type sensor pixels 610V alone. Surfaces with substantially homogenous or well-understood CIs can be found in an indoor room with no additional infrared light source, and with any infrared light projector in the system disabled. Similarly, in an outdoor environment, ambient sunlight typically provides largely diffuse illumination on each surface (based on that surface's infrared reflectance), and thus, the infrared illumination for each surface is largely homogenous or predictable.

In the case of a modulated infrared projector (as described above), information regarding a projected infrared pattern can be used to calculate an effective resolution of a visible light image that is higher than the number of V-type sensor pixels 610V (e.g., P/2) in the sensor 602. Information regarding a dynamically altering projected infrared pattern in certain regions of the surface (as described above) can also be used to calculate an increased effective visible light image resolution. Further, the sensor 602 may be use as a full resolution visible light sensor when all sources of infrared light are eliminated from the environment (e.g., indoor with no infrared sources).

Other methods according to various embodiments can include more than two passes to increase the accuracy of the estimated CV and CI. Still other embodiments use other measured that calculated values to estimated CV and CI for an F-type sensor pixel 610F. For instance, using data acquired by the hybrid visible/full spectrum light sensor 602 depicted in FIG. 17, CV and CI of 610F1 can be estimated using CV and CI of 610F2-610F5 in addition to V of 610V1-610V4. FIG. 18 shows that the 610F1 is surrounded by even more F-type and V-type sensor pixels that can provide even more optical data for estimation of CV and CI of 610F1. One factor in estimation methods using all F-type and V-type sensor pixels is that the sum of F for all F-type sensor pixels 610F should be at least as bright (if not brighter) than the sum of V for all V-type sensor pixels 610V.

Figure 19:
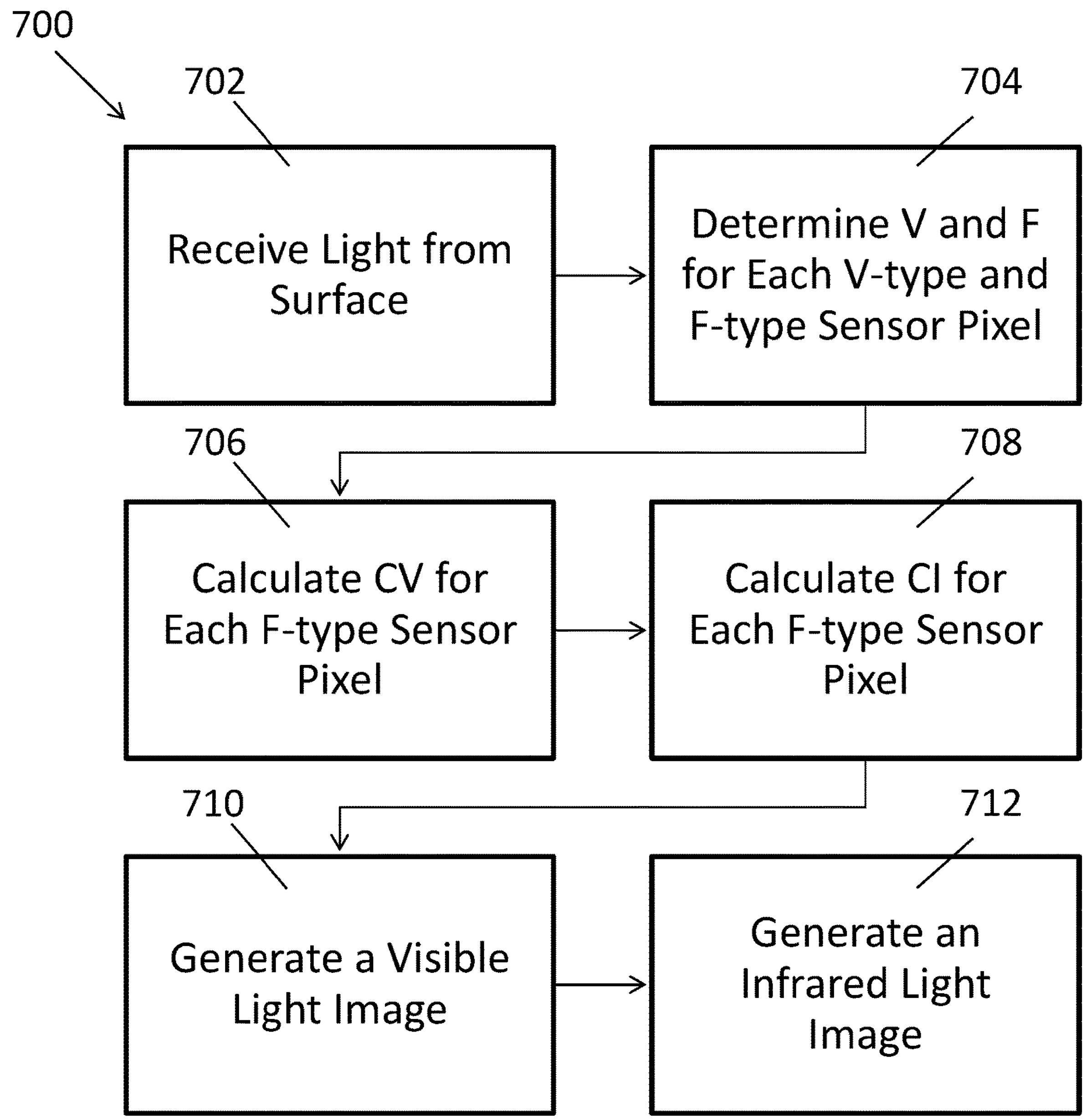
FIGS. 19 and 21 are flowcharts depicting image processing methods according to two embodiments.

Similar processes can be used to calculate the CI of F-type sensor pixels 610F in the sensor 602, and generate an estimated infrared light only image, despite having no dedicated infrared-only pixels. For instance, FIG. 19 depicts an image processing method 700 for generating separate visible and infrared images from optical data acquired by a single hybrid visible/full spectrum light sensor 602 according to one embodiment.

At step 702, the depth sensing system 600 receives light reflected from a surface. The hybrid visible/full spectrum light sensor 602 simultaneously receives visible light at each V-type sensor pixel 610V and full spectrum light at each F-type sensor pixel 610F.

At step 704, the depth sensing system 600 determines a visible light value ("V") for each V-type sensor pixel 610V based on the visible light received by the pixel 610V. At step 704, the depth sensing system 600 also determines a full spectrum light value ("F") for each F-type sensor pixel 610F based on the full spectrum light received by the pixel 610V.

At step 706, the depth sensing system 600 (e.g., the image processor 608) calculates a calculated visible light value ("CV") for each F-type sensor pixel 610F. The image processor 608 can calculate CV using the V for the V-type sensor pixels 610V adjacent to each F-type sensor pixel 610F. In a simple embodiment, the Vs of the four V-type sensor pixels 610V adjacent to an F-type sensor pixel 610F are averaged to generate CV. For example, in the hybrid visible/full spectrum light sensor 602 depicted in FIG. 16, the Vs of 610V1-610V4 are averaged to generate a CV for 610F1. This embodiment is most accurate for homogenous surfaces (e.g., a white wall), but accuracy drops off as surfaces become more heterogeneous.

In another embodiment, edge detection and gradient detection can be performed on the opposite facing neighbors to determine a more accurate CV by taking into account non-homogenous surfaces including edges. For example, in the hybrid visible/full spectrum light sensor 602 depicted in FIG. 16, edge detection and gradient detection can be performed on the Vs of 610V1/610V3 and 610V2/610V4. If a large gradient is found between the Vs of 610V1/610V3, those Vs may be given less weight when generating a CV for 610F1. This embodiment is more accurate for heterogeneous surfaces (e.g., a corner including an edge).

At step 708, the depth sensing system 600 (e.g., the image processor 608) calculates a calculated infrared light value ("CI") for each F-type sensor pixel 610F. The image processor 608 can calculate CI using the CV for the F-type sensor pixel 610F. In a simple embodiment, CI is calculated by subtracting CV from F for the F-type sensor pixel 610F.

At step 710, the depth sensing system 600 (e.g., the image processor 608) generates a visible light image using the Vs from the V-type sensor pixels 610V and the CVs calculated for the F-type sensor pixels 610F. At step 712, the depth sensing system 600 (e.g., the image processor 608) generates an infrared light image using the CIs calculated for the F-type sensor pixels 610F. The visible light image, the infrared light image, or both can be used for depth sensing.

Further, demosaicing and/or edge sharpening algorithms can optionally be applied to the image data to resolve the visible light value of the V-type sensor pixels 610V and the full spectrum light value of the F-type sensor pixels 610F prior to step 704. Resolving these light values V, F increases the accuracy of the method 700.

The systems 600 described herein use optical data from a single hybrid visible/full spectrum light sensor 602 to generate a visible light image with an effective resolution higher than P/2, and similarly, an infrared light image at approximately a lower resolution, on the same physical sensor 602. As such, the light used to generate the visible and infrared light images will pass through the same lens-stack, so any minor imperfections are reflected in both the visible and infrared light images. This arrangement has two further advantages over existing systems. First, the visible and infrared light images will be taken from exactly the same optical vantage point, giving a perfect 6-DOF correspondence for the focal point of the respective images. This obviates the need for registration and calibration, which is an especially difficult problem for systems including separate cameras operating on different wavelength spectra, as the cameras may not be able to detect the same calibration targets. Further, registration and calibration introduces an additional source of error that decreases the sub-pixel accuracy of any later-stage operations performed on the image data. Second, the exact same sensor is used, and as such, exposure times on the two images are perfectly synchronized. For images of surfaces in relative motion (of the sensor, the surface or both), the visible and infrared light images match temporally (even in the microsecond timescale) as well as geometrically, allowing for more precise and detailed analysis of the image.

Figure 20:
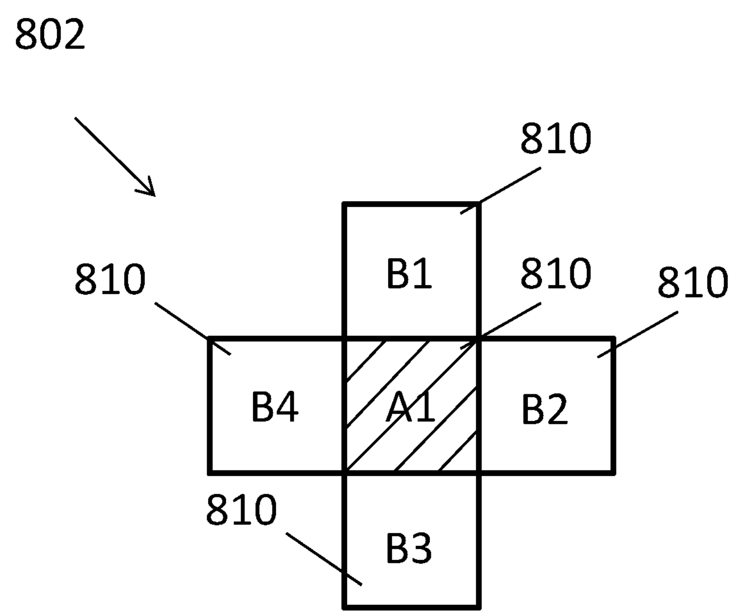
FIG. 20 is a detailed schematic view of a light sensor for depth sensing systems according to another embodiment.

In another embodiment, depicted in FIG. 20, the hybrid visible/full spectrum light sensor 802 includes two types of sensor pixels 810: A-type and B-type. A-type and B-type sensor pixels 810A, 810B both detect both visible and infrared light, but in different proportions. In one embodiment, A-type sensor pixels 810A may detect 75% of the visible light ("pV_A") and 25% of the infrared light ("pI_A") impinging on the pixel 810A. In that embodiment, B-type sensor pixels 810B may detect 60% of the visible light ("pV_B") and 40% of the infrared light ("pI_B") impinging on the pixel 810A. While the pV and pI components in this embodiment add up to 100%, in other embodiments, the pV and pI components can add up to more or less than 100%. For instance, the F-type (full spectrum) sensor pixels 610F in the hybrid visible/full spectrum light sensor 602 depicted in FIGS. 16-18, and described above have pV=100% and pI=100%.

In such sensors 802, each sensor pixel 810 has a sensed value ("SV") corresponding to the detected visible and infrared light. Because SV for a particular A-type sensor pixel 810A ("SV_A") is composed of two contributors (i.e., total visible light value "V" and total infrared light value "I" as modified by the proportion of each type of light detected by the sensor pixel 810A), we know that SV_A=(V*pV_A)+(I*pI_A).

Each A-type sensor pixel 810A also has an estimated value ("EV_A") calculated using optical data from the adjacent sensor pixels 810 (e.g., cardinal neighbors). For instance, 810A1 has an EV calculated from the SV for 810B1-810B4. In other words: EV_A=f ((V*pV_B)+(I*pI_B)) for 810B1-810B4. The function f can be as simple as averaging. In other embodiments, the function f may include edge detection and gradient detection, as described above.

SV_A is determined by the sensor pixel 810A and EV_A is estimated. pV_A, pI_A, pV_B, pI_B are known from the design of the sensor 802. With these determined, estimated and known values, the two equations SV_A=(V*pV_A)+(I*pI_A) and EV_A=f ((V*pV_B)+(I*pI_B)) can be solved for V and I for each A-type sensor pixel 810A. A similar process can be used to determined V and I for each B-type sensor pixel 810A.

Figure 21:
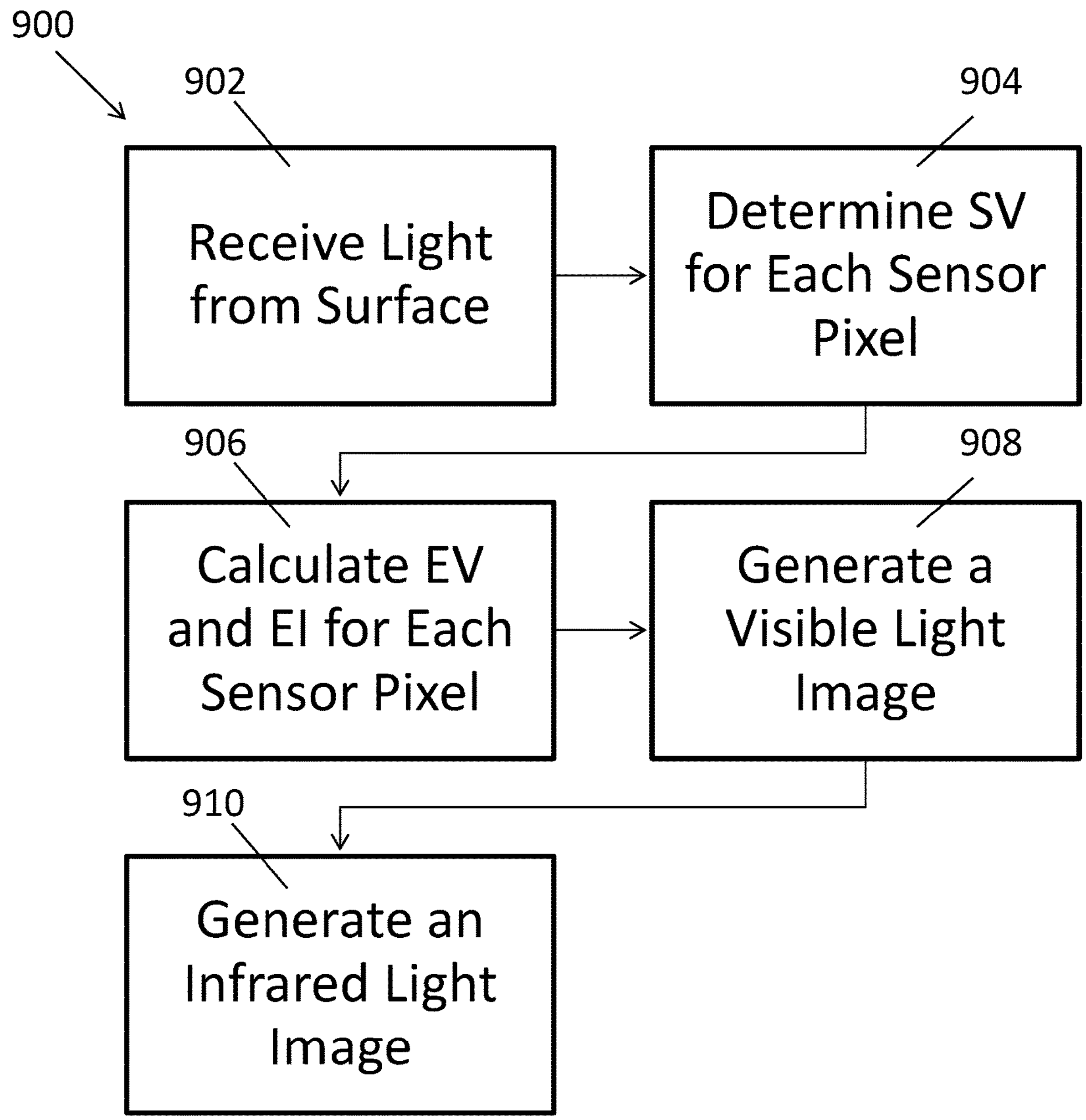

FIG. 21 depicts an image processing method 900 for generating separate visible and infrared images from optical data acquired by a single hybrid visible/full spectrum light sensor 802 according to one embodiment.

At step 902, the depth sensing system receives light reflected from a surface. The hybrid visible/full spectrum light sensor 802 simultaneously receives full spectrum light at each sensor pixel 810 (both A-type and B-type), with the percentage of visible and infrared light detected dependent on the pV and pI of each A-type and B-type sensor pixel 810.

At step 904, the depth sensing system determines a sensed light value ("SV") for each sensor pixel 810.

At step 906, the depth sensing system calculates a total visible light value ("V") and a total infrared light value ("I") for each sensor pixel 810. For instance, the depth sensing system can calculate V and I for each sensor pixel by simultaneously solving the pair of equations described above (i.e., SV_A=(V*pV_A)+(I*pI_A) and EV_A=f ((V*pV_B)+(I*pI_B))) using the known pV and pI values and the detected SV and estimated EV values, as described above.

At step 908, the depth sensing system generates a visible light image using the calculated Vs for the sensor pixels 810. At step 910, the depth sensing system generates an infrared light image using the calculated Is for the sensor pixels 810. The visible light image, the infrared light image, or both can be used for depth sensing.

While the method 900 depicted in FIG. 21 generates first a visible light image then an infrared light image, in other embodiments, a depth sensing system may generate first an infrared light image, then a visible light image. In still other embodiments, the depth sensing system may generate either a visible light image or an infrared light image without generating the other image.

While the dynamic non-aliasing pattern projector and image sensor with augmented depth sensing are described as part of one system in some embodiments, the projector and sensor are independent and each can function with all of the described benefits without the other.

While the above-referenced sensors are described as depth sensing, sensors according to the embodiments can be used in other visible/infrared light systems, such as camera focusing systems. The above-described depth sensing systems are provided as examples of various optical systems that can benefit from hybrid sensors. Accordingly, use of the optical systems described herein is not limited to the disclosed depth sensing systems, but rather applicable to any optical system.

Various exemplary embodiments of the invention are described herein. Reference is made to these examples in a non-limiting sense. They are provided to illustrate more broadly applicable aspects of the invention. Various changes may be made to the invention described and equivalents may be substituted without departing from the true spirit and scope of the invention. In addition, many modifications may be made to adapt a particular situation, material, composition of matter, process, process act(s) or step(s) to the objective(s), spirit or scope of the present invention. Further, as will be appreciated by those with skill in the art that each of the individual variations described and illustrated herein has discrete components and features which may be readily separated from or combined with the features of any of the other several embodiments without departing from the scope or spirit of the present inventions. All such modifications are intended to be within the scope of claims associated with this disclosure.

The invention includes methods that may be performed using the subject devices. The methods may comprise the act of providing such a suitable device. Such provision may be performed by the end user. In other words, the "providing" act merely requires the end user obtain, access, approach, position, set-up, activate, power-up or otherwise act to provide the requisite device in the subject method. Methods recited herein may be carried out in any order of the recited events which is logically possible, as well as in the recited order of events.

Exemplary aspects of the invention, together with details regarding material selection and manufacture have been set forth above. As for other details of the present invention, these may be appreciated in connection with the above-referenced patents and publications as well as generally known or appreciated by those with skill in the art. The same may hold true with respect to method-based aspects of the invention in terms of additional acts as commonly or logically employed.

In addition, though the invention has been described in reference to several examples optionally incorporating various features, the invention is not to be limited to that which is described or indicated as contemplated with respect to each variation of the invention. Various changes may be made to the invention described and equivalents (whether recited herein or not included for the sake of some brevity) may be substituted without departing from the true spirit and scope of the invention. In addition, where a range of values is provided, it is understood that every intervening value, between the upper and lower limit of that range and any other stated or intervening value in that stated range, is encompassed within the invention.

Also, it is contemplated that any optional feature of the inventive variations described may be set forth and claimed independently, or in combination with any one or more of the features described herein. Reference to a singular item, includes the possibility that there are plural of the same items present. More specifically, as used herein and in claims associated hereto, the singular forms "a," "an," "said," and "the" include plural referents unless the specifically stated otherwise. In other words, use of the articles allow for "at least one" of the subject item in the description above as well as claims associated with this disclosure. It is further noted that such claims may be drafted to exclude any optional element. As such, this statement is intended to serve as antecedent basis for use of such exclusive terminology as "solely," "only" and the like in connection with the recitation of claim elements, or use of a "negative" limitation.

Without the use of such exclusive terminology, the term "comprising" in claims associated with this disclosure shall allow for the inclusion of any additional element—irrespective of whether a given number of elements are enumerated in such claims, or the addition of a feature could be regarded as transforming the nature of an element set forth in such claims. Except as specifically defined herein, all technical and scientific terms used herein are to be given as broad a commonly understood meaning as possible while maintaining claim validity.

The breadth of the present invention is not to be limited to the examples provided and/or the subject specification, but rather only by the scope of claim language associated with this disclosure.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A depth sensing system, comprising:

a spatially modulated light projection device to project light toward a surface;

a sensor to receive the light reflected from the surface;

an actuator to control spatial modulation of the light projection device to form first and second sin waves that are phase-offset from each other to form a plurality of intersecting light segments; and a processor to receive light information from the sensor and to analyze the light reflected from the surface to determine a depth of the surface, wherein the light comprises infrared light having a wavelength from about 700 nm to about 1 mm, and wherein the actuator controls spatial modulation of the light projection device to sequentially change a subset of the plurality of the intersecting light segments to form a dynamic pattern.

2. The system of claim 1, wherein the light comprises visible light having a wavelength from about 390 nm to about 700 nm.

3. The system of claim 2, wherein the actuator controls spatial modulation of the light projection device to form a pattern comprising the infrared light and the visible light.

4. The system of claim 1, wherein the actuator controls spatial modulation of the light projection device to form two or more intersecting line segments on the surface.

5. The system of claim 4, wherein the actuator controls spatial modulation of the light projection device to form a dynamic pattern comprising the at least two intersecting line segments on the surface.

6. The system of claim 4, wherein the actuator controls spatial modulation of the light projection device to form a pattern comprising a plurality of discrete intersecting line segments on the surface.

7. The system of claim 1, wherein controlling spatial modulation of the light projection device includes controlling movement of at least a portion of the light projection device.

8. The system of claim 7, wherein controlling spatial modulation of the light projection device includes controlling projection of the light by the light projection device.

9. The system of claim 1, the spatially modulated light projection device comprising a fiber scanned display.

10. The system of claim 1, wherein controlling spatial modulation of the light projection device comprises varying a phase-offset or a scan frequency of the light projection device.

11. The system of claim 1, wherein the actuator controls spatial modulation of the light projection device to sequentially change the shape of the first and second sin waves to form the dynamic pattern.

12. The system of claim 1, wherein the actuator controls spatial modulation of the light projection device to sequentially phase shift the light to form a dynamic pattern.

13. The system of claim 1, further comprising a light source to generate the light.

14. The system of claim 13, wherein the light source is a laser.

15. The system of claim 13, wherein the actuator also controls (activation on/off) the light source.

16. The system of claim 15, wherein the actuator controls spatial modulation of the light projection device to form first and second sin waves, and wherein the actuator activates the light source only when the first and second sin waves intersect with each other.

17. The system of claim 1, wherein the processor comprises a pattern designer to generate patterns and to send data specifying the generated patterns to the actuator.

18. The system of claim 1, wherein the processor comprises a pattern detector to receive optical data from the sensor and to extract information of the pattern from the received optical data.

* * * * *